(12) United States Patent
Tamura et al.

(10) Patent No.: US 10,068,890 B2
(45) Date of Patent: Sep. 4, 2018

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventors: Hikaru Tamura, Kanagawa (JP); Naoaki Tsutsui, Kanagawa (JP); Atsuo Isobe, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/667,672

(22) Filed: Aug. 3, 2017

(65) Prior Publication Data

US 2017/0330873 A1 Nov. 16, 2017

Related U.S. Application Data

(63) Continuation of application No. 15/014,081, filed on Feb. 3, 2016, now Pat. No. 9,729,148.

(30) Foreign Application Priority Data

Feb. 9, 2015 (JP) .................................. 2015-022933

(51) Int. Cl.
*H01L 25/00* (2006.01)
*H01L 27/02* (2006.01)
(Continued)

(52) U.S. Cl.
CPC ........ *H01L 27/0207* (2013.01); *H01L 23/528* (2013.01); *H01L 23/53214* (2013.01);
(Continued)

(58) Field of Classification Search
CPC .. H03K 19/008; H03K 19/0013; H01L 23/52; H01L 23/522; H01L 23/53214
(Continued)

(56) References Cited

U.S. PATENT DOCUMENTS 7,635,988 B2 * 12/2009 Madurawe ............ G11C 11/412
326/101
8,274,309 B2 * 9/2012 Madurawe .......... H01L 27/0207
326/101
(Continued)

FOREIGN PATENT DOCUMENTS

JP 2004-133638 A 4/2004
JP 2011-187950 A 9/2011
(Continued)

OTHER PUBLICATIONS

Tamura.H et al., "Embedded SRAM and Cortex-M0 Core with Backup Circuits Using a 60-nm Crystalline Oxide Semiconductor for Power Gating", IEEE COOL CHIPS XVII, Apr. 14, 2014, p. 3pages.
(Continued)

*Primary Examiner* — Jason M Crawford
(74) *Attorney, Agent, or Firm* — Fish & Richardson P.C.

(57) ABSTRACT

To provide a semiconductor device including element layers that are stacked. A first wiring layer and a second wiring layer are stacked between a first element layer and a second element layer. A third wiring layer and a fourth wiring layer are stacked over the second element layer. Transistors of logic cells are provided in the first element layer. Wirings of the logic cells are provided in the first wiring layer or the second wiring layer. Input ports and output ports of the logic cells are provided in the third wiring layer. The input port of one of the logic cells is connected to the output port of another logic cell through the wiring of the third wiring layer or the fourth wiring layer. Connecting the logic cells through
(Continued)

the wiring layers over the second element layer improves the efficiency of steps of arranging and connecting the logic cells.

21 Claims, 17 Drawing Sheets

(51) Int. Cl.
    *H01L 27/12*     (2006.01)
    *H01L 27/06*     (2006.01)
    *H01L 23/528*     (2006.01)
    *H01L 23/532*     (2006.01)
    *H01L 29/786*     (2006.01)
    *H03K 19/00*     (2006.01)

(52) U.S. Cl.
    CPC .. *H01L 23/53228* (2013.01); *H01L 23/53257* (2013.01); *H01L 27/0688* (2013.01); *H01L 27/1207* (2013.01); *H01L 27/1274* (2013.01); *H01L 29/7869* (2013.01); *H03K 19/0008* (2013.01)

(58) Field of Classification Search
    USPC ............................................ 326/47, 101–103
    See application file for complete search history.

(56) References Cited

U.S. PATENT DOCUMENTS

| | | | |
|---|---|---|---|
| 8,482,974 B2 | 7/2013 | Saito et al. | |
| 8,674,470 B1* | 3/2014 | Or-Bach | H01L 24/25 257/499 |
| 8,787,102 B2 | 7/2014 | Ishizu | |
| 9,054,200 B2 | 6/2015 | Okazaki et al. | |
| 9,171,630 B2 | 10/2015 | Nagatsuka et al. | |
| 9,202,814 B2 | 12/2015 | Ishizu | |
| 9,729,148 B2* | 8/2017 | Tamura | H03K 19/0008 |
| 2005/0116738 A1* | 6/2005 | Auracher | G06F 17/5054 326/47 |
| 2011/0084314 A1* | 4/2011 | Or-Bach | G03F 9/7076 257/209 |
| 2011/0309353 A1 | 12/2011 | Kaneko et al. | |
| 2013/0270550 A1 | 10/2013 | Okazaki et al. | |
| 2013/0285049 A1 | 10/2013 | Ohmaru et al. | |
| 2014/0269063 A1 | 9/2014 | Nagatsuka et al. | |
| 2014/0293711 A1 | 10/2014 | Kato et al. | |
| 2016/0105174 A1 | 4/2016 | Uesugi et al. | |

FOREIGN PATENT DOCUMENTS

| | | |
|---|---|---|
| JP | 2012-028731 A | 2/2012 |
| JP | 2013-008437 A | 1/2013 |
| JP | 2013-236059 A | 11/2013 |
| JP | 2013-243351 A | 12/2013 |
| JP | 2013-243353 A | 12/2013 |
| JP | 2014-199708 A | 10/2014 |
| JP | 2014-209726 A | 11/2014 |
| KR | 2015-0005919 A | 1/2015 |
| KR | 2015-0128823 A | 11/2015 |
| TW | 201405829 | 2/2014 |
| TW | 201447883 | 12/2014 |
| WO | WO-2013/154115 | 10/2013 |
| WO | WO-2014/142332 | 9/2014 |

OTHER PUBLICATIONS

International Search Report (Application No. PCT/IB2016/050388) dated Apr. 26, 2016.
Written Opinion (Application No. PCT/IB2016/050388) dated Apr. 26, 2016.

* cited by examiner

SEMICONDUCTOR DEVICE, ELECTRONIC COMPONENT, AND ELECTRONIC DEVICE

CROSS-REFERENCE TO RELATED APPLICATIONS

This application is a continuation of U.S. application Ser. No. 15/014,081, filed Feb. 3, 2016, now allowed, which claims the benefit of a foreign priority application filed in Japan as Serial No. 2015-022933 on Feb. 9, 2015, both of which are incorporated by reference.

TECHNICAL FIELD

The specification, drawings, and claims of this application (hereinafter referred to as "this specification and the like") disclose, for example, a semiconductor device, an electronic component, an electronic device, operating methods thereof, and manufacturing methods thereof. Examples of a technical field of one embodiment of the present invention include a semiconductor device, a storage device, a processing unit, a switch circuit (e.g., a power switch and a wiring switch), a display device, a liquid crystal display device, a light-emitting device, a lighting device, a power storage device, an input device, an imaging device, a driving method thereof, and a manufacturing method thereof.

BACKGROUND ART

An example of a method for designing a semiconductor device such as SOC is a standard cell method. In this designing method, a plurality of cells (also referred to as logic cells or standard cells, for example) are prepared for individual functions, and a semiconductor device is fabricated using them as its components. In the case of a standard cell method, steps of arranging cells and connecting wirings between the cells are performed with an automatic placer and router.

A variety of semiconductor devices that take advantage of the extremely low off-state current of a transistor whose semiconductor region is formed using an oxide semiconductor (hereinafter, such a transistor may be referred to as an OS transistor) have been proposed.

For example, Patent Documents 1 and 2 each disclose a storage circuit using an OS transistor. Non-Patent Document 1 discloses a processor that is capable of power gating and in which backup circuits using OS transistors are provided in a flip-flop and an SRAM. Patent Document 3 discloses a semiconductor device using a combination of a standard cell including a Si transistor and an OS transistor and a standard cell including a Si transistor.

REFERENCE

Patent Documents

[Patent Document 1] Japanese Published Patent Application No. 2011-187950
[Patent Document 2] Japanese Published Patent Application No. 2013-008437
[Patent Document 3] Japanese Published Patent Application No. 2013-243351

Non-Patent Document

[Non-Patent Document 1] H. Tamura et al., "Embedded SRAM and Cortex-M0 Core with Backup Circuits Using a 60-nm Crystalline Oxide Semiconductor for Power Gating," IEEE COOL Chips XVII, April 2014.

DISCLOSURE OF INVENTION

A novel semiconductor device, an operating method for the novel semiconductor device, or a manufacturing method for the novel semiconductor device is provided. Alternatively, a novel semiconductor device including at least two element layers that are stacked, an operating method for the novel semiconductor device, or a manufacturing method for the novel semiconductor device is provided. Alternatively, a semiconductor device capable of power gating or an operating method for the semiconductor device is provided. Alternatively, a method that allows efficient designing of a semiconductor device is provided.

Note that the description of a plurality of objects does not preclude the existence of each object. Note that one embodiment of the present invention does not necessarily achieve all the objects listed above. Other objects will be apparent from and can be derived from the description of the specification, the drawings, the claims, and the like, and such objects could be objects of one embodiment of the present invention.

(1) One embodiment of the present invention is a semiconductor device including a plurality of logic cells. The semiconductor device includes a first element layer, a second element layer, and first to k-th wiring layers (k is an integer of greater than 3). Each of the first element layer and the second element layer is provided with a plurality of transistors. The first to k-th wiring layers are stacked in this order. The first element layer is provided under the first wiring layer. The second element layer is provided between the second wiring layer and the third wiring layer. The transistors of the logic cells are provided in the first element layer. Wirings of the logic cells are provided in the first wiring layer or the second wiring layer. An input port and an output port of the logic cell are provided in the third wiring layer.

In the above embodiment (1), the input port of one of the logic cells may be electrically connected to the output port of another logic cell through the wiring of the third wiring layer or through the wiring of the third wiring layer and the wiring of a fourth wiring layer.

In the above embodiment (1), the resistivities of the third to k-th wiring layers can be lower than those of the first wiring layer and the second wiring layer. Alternatively, the wirings of the first wiring layer and the second wiring layer may contain a conductor containing tungsten, and the wirings of the third to k-th wiring layers may contain a conductor containing copper or aluminum.

In the above embodiment (1), the plurality of transistors of the second element layer may each include an oxide semiconductor layer where a channel is formed.

In the above embodiment (1), the length of a wiring grid interval of the third wiring layer is 1.5 times or 2 times that of a wiring grid interval of the second wiring layer.

In the above embodiment (1), no second wiring layer may be provided.

Note that in this specification and the like, a semiconductor device refers to a device that can function by utilizing semiconductor characteristics, and means a circuit including a semiconductor element (e.g., a transistor, a diode, or a photodiode), a device including the circuit, or the like. A chip including an integrated circuit, and an electronic component, a storage device, a display device, a light-emitting element, a lighting device, and an electronic device each including a chip in a package are examples of semiconductor devices and may include semiconductor devices.

In this specification and the like, the description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text. Here, each of X and Y denotes an object (e.g., a device, an element, a circuit, a wiring, an electrode, a terminal, a conductive film, or a layer).

A transistor includes three nodes (terminals) called a gate, a source, and a drain. A gate is a node that controls the conduction state of a transistor. Depending on the channel type of the transistor or the levels of potentials supplied to the terminals, one of nodes (an input node and an output node) functions as a source and the other functions as a drain. Therefore, the terms "source" and "drain" are interchangeable in this specification and the like. Furthermore, the two terminals other than the gate may be referred to as a first terminal and a second terminal in this specification and the like.

A node can be referred to as a terminal, a wiring, an electrode, a conductive layer, a conductor, an impurity region, or the like, depending on a circuit configuration, a device structure, and the like. Furthermore, a terminal, a wiring, or the like can be referred to as a node.

Note that in many cases, a voltage refers to a potential difference between a certain potential and a reference potential (e.g., a ground potential (GND) or a source potential). A voltage can be referred to as a potential and vice versa. Note that a potential has a relative value. Thus, "GND" does not necessarily mean 0 V.

In this specification and the like, ordinal numbers such as "first," "second" and "third" are used to show the order in some cases. Alternatively, ordinal numbers such as "first," "second" and "third" are used to avoid confusion among components in some cases, and do not limit the number of components or do not limit the order. For example, it is possible to replace the term "first" with the term "second" or "third" in describing one embodiment of the present invention.

Other matters regarding the description of this specification and the like will be described in Embodiment 4.

A novel semiconductor device, an operating method for the novel semiconductor device, or a manufacturing method for the novel semiconductor device can be provided. Alternatively, a novel semiconductor device including at least two element layers that are stacked, an operating method for the novel semiconductor device, or a manufacturing method for the novel semiconductor device can be provided. Alternatively, a semiconductor device capable of power gating or an operating method for the semiconductor device can be provided. Alternatively, a semiconductor device can be efficiently designed.

Note that the description of the plurality of effects does not disturb the existence of other effects. In one embodiment of the present invention, there is no need to achieve all the effects described above. In one embodiment of the present invention, an object other than the above objects, an effect other than the above effects, and a novel feature will be apparent from the description of the specification and the drawings.

BEST MODE FOR CARRYING OUT THE INVENTION

Embodiments of the present invention will be described below. Note that one embodiment of the present invention is not limited to the following description. It will be readily appreciated by those skilled in the art that modes and details of the present invention can be modified in various ways without departing from the spirit and scope of the present invention. Therefore, one embodiment of the present invention should not be construed as being limited to the following description of the embodiments.

Any of the embodiments described below can be combined as appropriate. In addition, in the case where some structural examples (including a manufacturing method, an operating method, and the like) are given in one embodiment, any of the structural examples can be combined as appropriate, and any of the structural examples can be combined with one or more structural examples described in the other embodiments.

In this specification, a high power supply potential VDD may be abbreviated to a potential VDD, VDD, or the like, for example. The same applies to other components (e.g., a signal, a voltage, a potential, a circuit, an element, an electrode, and a wiring).

Embodiment 1

<<Structural Example 1 of Semiconductor Device>>

Figure 1B:
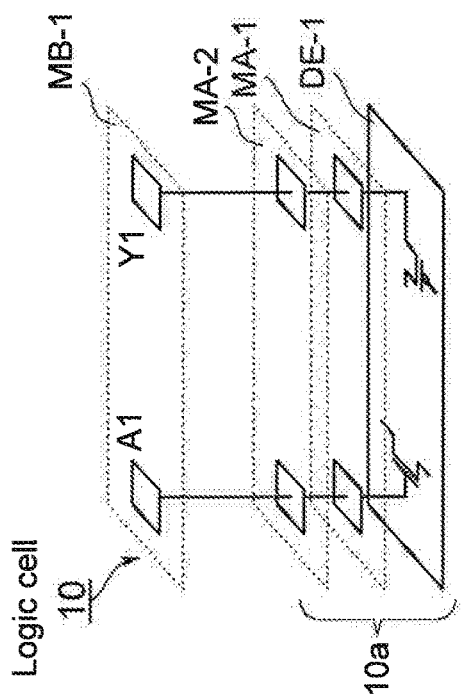
FIGS. 1A to 1D are schematic diagrams illustrating structural examples of a semiconductor device and logic cells.
Figure 1D:
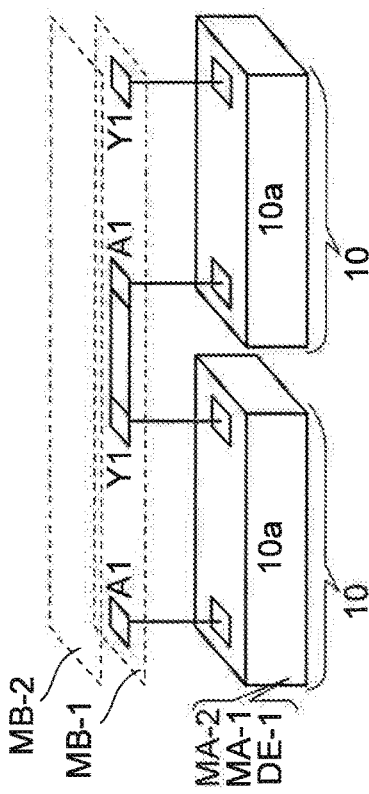
Figure 1A:
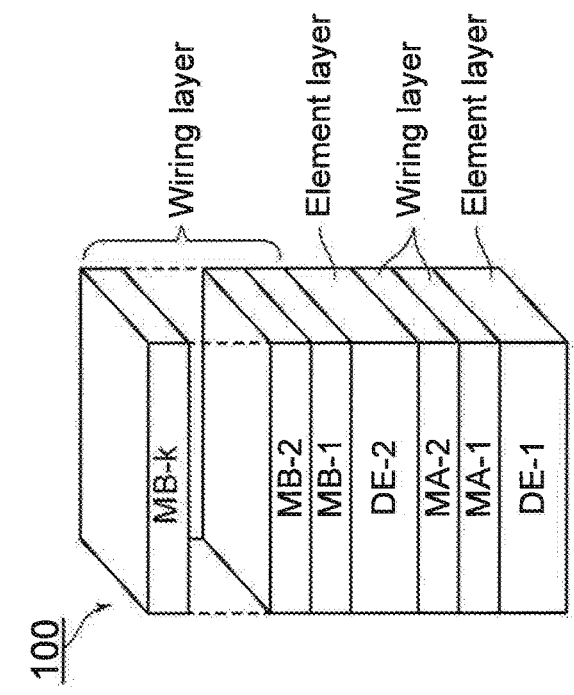

Here, a semiconductor device in which two element layers are stacked will be described. FIG. 1A schematically illustrates a layered structure of a semiconductor device. A semiconductor device 100 includes two element layers DE-1 and DE-2, two wiring layers MA-1 and MA-2, and k wiring layers MB-1 to MB-k (k is an integer of greater than 1). The wiring layers MA-1, MA-2, and MB-1 to MB-k are stacked in this order. The element layer DE-2 is stacked over the element layer DE-1. The wiring layers MA-1 and MA-2 are provided between the element layer DE-1 and the element layer DE-2. The wiring layers MB-1 to MB-k are stacked over the element layer DE-2.

The wiring layers MA-1, MA-2, and MB-1 to MB-k are each provided with a plurality of wirings. The element layers DE-1 and DE-2 are each provided with a plurality of transistors. The element layers DE-1 and DE-2 can be provided with a resistor, a capacitor, a diode, and the like in addition to the transistors.

In the semiconductor device 100, an interlayer insulating layer is provided between two adjacent wiring layers so as to isolate the two layers from each other. To electrically connect the wiring in an upper layer and the wiring in a lower layer, the interlayer insulating layer is provided with a plug. Similarly, an interlayer insulating layer is provided also between the element layer and the wiring layer that are adjacent to each other, and the elements of the element layer and the wirings of the wiring layer are connected to each other by the plug.

<Element Layers>

The element layers DE-1 and DE-2 are formed through different processes; thus, the device structure, materials of components, or the like of the transistor of the element layer DE-1 (hereinafter referred to as a transistor DE1) can be different from that of the transistor of the element layer DE-2 (hereinafter referred to as a transistor DE2).

For example, the transistor DE1 can be formed over a semiconductor substrate. As the semiconductor substrate, a semiconductor substrate of a Group 14 element such as silicon, germanium, or the like, or a compound semiconductor substrate of silicon carbide, silicon germanium, gallium arsenide, indium phosphide, zinc oxide, or gallium oxide can be used, for example. The semiconductor substrate may be either a bulk semiconductor substrate or a silicon on insulator (SOI) substrate in which a semiconductor substrate is provided with a semiconductor layer with an insulating region therebetween. The crystal structure of the semiconductor substrate is preferably a single crystal structure or a polycrystalline structure. A semiconductor region of the transistor DE1 depends on a material and the crystal structure of the semiconductor substrate.

A semiconductor region of the transistor DE2 is formed over the wiring layer MA-2 using a semiconductor deposited by a gas phase method. A semiconductor included in the semiconductor region is roughly divided into a single crystal semiconductor and a non-single-crystal semiconductor. As the non-single-crystal semiconductor, a polycrystalline semiconductor, a microcrystalline semiconductor, an amorphous semiconductor, and the like are given. As a semiconductor material, a Group 14 semiconductor containing one kind or a plurality of kinds of Group 14 elements such as Si, Ge, and C (e.g., silicon, germanium, silicon carbide, or silicon germanium), an oxide semiconductor (e.g., an In—Ga—Zn oxide), a compound semiconductor, and the like are given.

In the case where a semiconductor region of the transistor DE2 is formed of silicon, the semiconductor region can be formed using amorphous silicon deposited by a vapor deposition method, a sputtering method, or the like, or polycrystalline silicon obtained by crystallizing amorphous silicon, for example. For the crystallization of amorphous silicon, heat treatment, laser irradiation treatment, or the like can be used. Alternatively, the semiconductor region of the transistor DE2 can be formed using an oxide semiconductor deposited by a vapor deposition method, a sputtering method, or the like. In this case, the transistor DE2 is an OS transistor.

<Logic Cell>

The semiconductor device 100 includes one or more circuits composed of a plurality of logic cells 10. FIG. 1B schematically illustrates the structure of the logic cell 10. The logic cell 10 includes one or more transistors, a plurality of wirings, a port A1, and a port Y1. The port A1 is an input port, and a port Y1 is an output port.

In the logic cell 10, a plurality of transistors are provided in the element layer DE-1. The plurality of transistors are electrically connected through the wiring provided in the wiring layer MA-1 or the wiring layer MA-2 so that a logic circuit 10a with a predetermined processing function is constructed.

The logic circuit 10a has a function of processing data of the port A1 and outputting the processed data from the port Y1. There is no particular limitation on the configuration of the logic circuit 10a. For example, a basic logic gate circuit such as an inverter circuit or a NAND circuit, a flip-flop, a latch circuit, a counter, a multiplexer, or the like can be used. Alternatively, a complicated logic circuit such as an arithmetic unit can be used.

Although the number of input ports of the logic cell 10 and the number of output port of thereof is each one here, depending on the circuit configuration of the logic cell 10, a plurality of input ports may be provided like the port A1. Furthermore, a plurality of output ports may be provided like the port Y1.

Figure 1C:
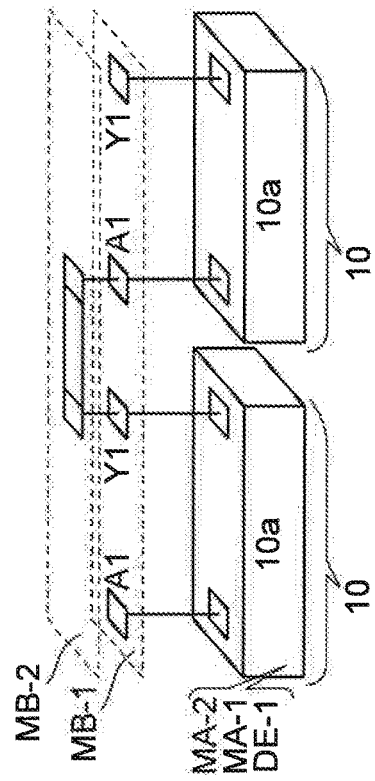

The port A1 and the port Y1 are provided in the wiring layer MB-1. Two logic cells 10 are electrically connected to each other through the wiring of the wiring layer MB-1 or the wiring of the wiring layer MB-2. FIGS. 1C and 1D schematically illustrate the connection between the two logic cells 10. In an example of FIG. 1C, the port Y1 of the logic cell 10 is electrically connected to the port A1 of another logic cell 10 through the wiring of the wiring layer MB-2. In an example of FIG. 1D, the port Y1 of the logic cell 10 is electrically connected to the port A1 of another logic cell 10 through the wiring of the wiring layer MB-1. In the semiconductor device 100, the logic circuit 10a is composed of the transistors DE1 and the wirings that are provided in the layers below the element layer DE-2, and the plurality of logic cells 10 (logic circuits 10a) are electrically connected through the wirings in the layers over the element layer DE-2.

That is, a circuit portion (logic circuit 10a) of the logic cell 10 is composed of a stack (DE-1, MA-2, and MA-3) under the element layer DE-2, and the input port and the output port of the circuit portion are provided in the wiring layer MB-1 stacked over the element layer DE-2.

<Wiring Layers>

In the semiconductor device 100, electrodes of the transistors DE1 and DE2, the wirings of the wiring layers, the plug that connects the wirings, and the like are preferably formed using a conductor with low resistivity (e.g., aluminum or copper). When the resistance of the wirings and the like is low, parasitic resistance and parasitic capacitance of the wirings are also low; thus, the delay of a signal can be inhibited, leading to reduction in power consumption. Furthermore, a via hole in which the plug is formed can be reduced in size, and this is advantageous for higher integration.

(MA-1 and MA-2)

Meanwhile, conductors of the wirings and the like of the wiring layers MA-1 and MA-2, which are formed below the element layer DE-2, need to withstand the treatment temperature in a formation process of the element layer DE-2 (transistor DE2). Unlike a Si transistor formed using a single crystal silicon wafer, a semiconductor region of the transistor DE2 is formed using a semiconductor deposited by a gas phase method. Thus, to improve the characteristics and reliability of the transistor DE2, the semiconductor region may be formed at treatment temperatures higher than or equal to 400° C. Heat treatment at such high temperatures is performed to improve the crystallinity of polycrystalline silicon, for example, in the case where the transistor DE2 is a polycrystalline silicon transistor. In the case where the transistor DE2 is an OS transistor, heat treatment at such high temperatures is performed to reduce oxygen vacancies in an oxide semiconductor region or to reduce hydrogen (H).

Therefore, the wirings and the like of the wiring layers MA-1 and MA-2 are preferably formed using a conductor having resistance to heat of approximately 400° C. (e.g., heat in the range from 400° C. to 500° C.). Examples of such a conductor include polycrystalline silicon to which an impurity such as phosphorus is added, silicide, a refractory metal, an alloy of refractory metals, and a compound of a refractory metal. Examples of refractory metals include tungsten, molybdenum, tantalum, titanium, chromium, niobium, vanadium, and platinum. Examples of an alloy of refractory metals that can be used for the wirings of the wiring layers MA-1 and MA-2 include a Ta—W alloy and a Mo—W alloy. Examples of a compound of a refractory metal include titanium nitride and tantalum nitride.

The wirings and the like of the wiring layers MA-1 and MA-2 are each either a single-layer conductor or a stack of conductors. The wirings of the wiring layers MA-1 and MA-2 and the plug connected to them are preferably formed using tungsten or molybdenum, each of which has both high heat resistance and high conductance, especially, tungsten.

(MB-1 to MB-k)

The wiring layer MB-j (j is an integer of 1 or more and k or less) is stacked over the element layer DE-2; thus, the wiring of the wiring layer MB-j and the plug connected to the wiring can be formed using a conductor having low heat resistance but having low resistance (e.g., a conductor containing aluminum or copper as its main component). Examples of such a low-resistance conductor include aluminum, copper, an aluminum alloy, an aluminum alloy (e.g., an Al—Mo alloy and an Al—Ti alloy) containing an element that prevents a hillock (e.g., Si, Cr, Sc, Ta, and Ti), and a copper alloy (e.g., a Cu—Mo alloy and a Cu—W alloy). The wirings of the wiring layer MB-j and the plug connected to the wirings are each either a single-layer conductor or a stack of conductors. In the case where each of them is a stack of conductors, a stack of the low-resistance conductor and the high heat-resistant conductor may be used. Such a stack can increase heat resistance of the wirings and the plug or can reduce migration. For example, in the case where a stack of conductors is provided, a refractory metal such as titanium, molybdenum, or tungsten or a nitride thereof (titanium nitride, molybdenum nitride, or tungsten nitride) can be provided under and/or over the low-resistance conductor. For example, the wirings and the plug can be each formed using three layers of conductors of titanium nitride, aluminum, and titanium nitride.

That is, for the wiring layer MB-j stacked over the element layer DE-2, a low-resistance conductor is used to achieve high-speed operation of the semiconductor device 100. Meanwhile, for the wiring layers MA-1 and MA-2 below the element layer DE-2, which require high heat resistance rather than low resistance, a conductor having higher resistivity than the conductor of the wiring layer MB-j is used. It is needless to say that depending on the process temperature for the element layer DE-2, the wirings of the wiring layers MA-1 and MA-2 can be formed using a low-resistance conductor like the wiring of the wiring layer MB-j.

Since all the transistors of the logic cells 10 are provided in the element layer DE-1, all the components of the logic circuits 10a are provided in the stack of the wiring layers MA-1 and MA-2 and the element layer DE-1 below the element layer DE-2 so that the logic circuits 10a can be easily arranged and connected. Furthermore, the port A1 and the port Y1 are provided in the wiring layer MB-1 over the element layer DE-2, whereby a step of arranging the logic cells 10 and a step of connecting wirings between a plurality of logic cells 10 can be easily performed in designing the semiconductor device 100. This enhances the design efficiency of the semiconductor device 100. Furthermore, connecting the plurality of logic cells 10 through the low-resistance wirings of the wiring layers MB-1 and MB-2 allows the logic cell 10 to operate at high frequencies.

Note that depending on the arrangement of the logic cells 10, it is better to connect the logic cells 10 through the wiring of the wiring layer MA-2 in some cases. In such logic cell 10, the port A1 and the port Y1 are provided in the wiring layer MA-2.

<<Structural Example of Semiconductor Device>>

In the case where the logic circuit 10a of the logic cell 10 can be designed with the use of the transistors DE1 of the element layer DE-1 and the wirings of the wiring layer MA-1, the wiring layer MA-2 is not necessarily provided. FIGS. 2A to 2D illustrate such structural examples.

Figure 2B:
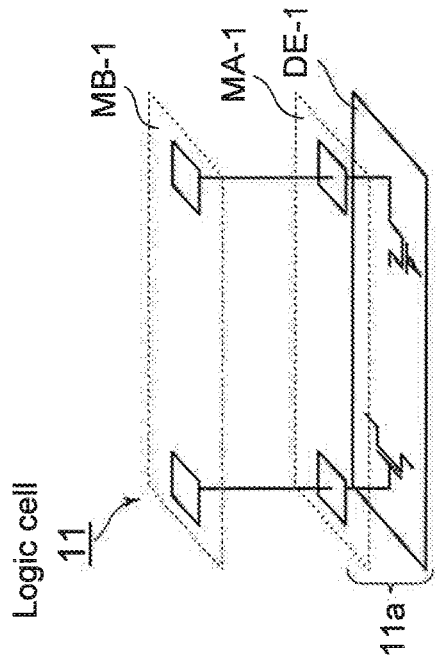
FIGS. 2A to 2D are schematic diagrams illustrating structural examples of a semiconductor device and logic cells.
Figure 2A:
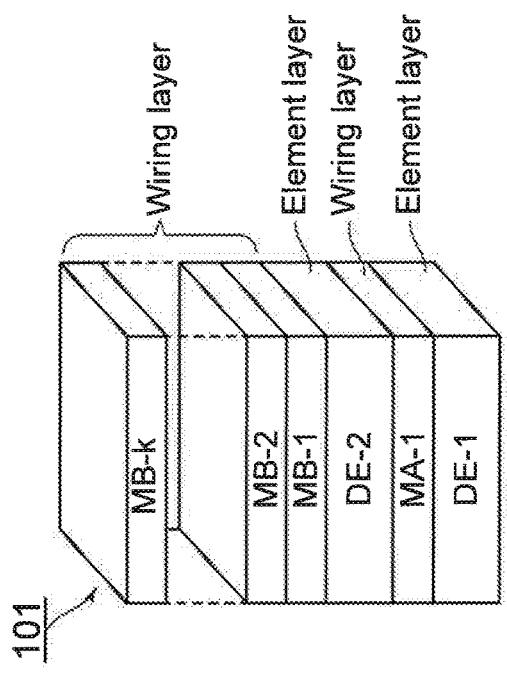

The semiconductor device 101 in FIG. 2A is a modification example of the semiconductor device 100 and is the same as the semiconductor device 100 except that the wiring layer MA-2 is not provided. The semiconductor device 101 includes a circuit composed of a plurality of logic cells 11. FIG. 2B schematically illustrates the configuration example of the logic cell 11. The logic cell 11 is a modification example of the logic cell 10, and a circuit portion (logic circuit 11a) of the logic cell 11 is composed of the element layer DE-1 and the wiring layer MA-1.

Figure 2D:
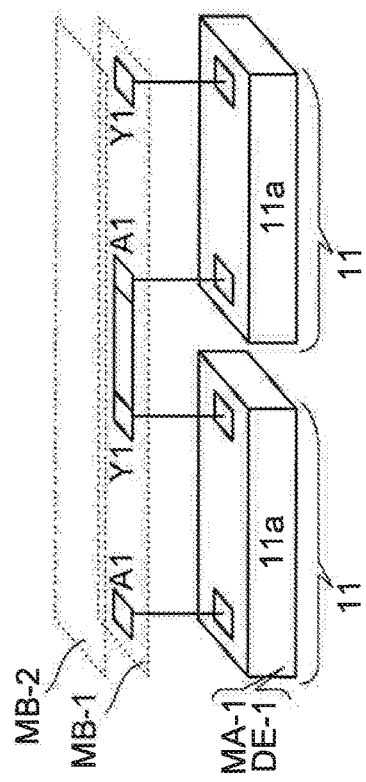
Figure 2C:
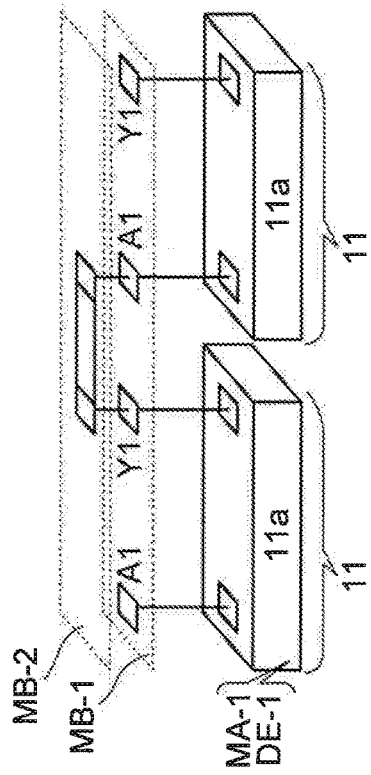

The logic cells 11 are connected like the logic cells 10. FIG. 2C illustrates an example where two logic cells 11 are connected to each other through the wiring of the wiring layer MB-2. FIG. 2D illustrates an example where two logic cells 11 are connected through the wiring of the wiring layer MB-1.

Although the number of input ports of the logic cell 11 and the number of output ports thereof are each one here, depending on the circuit configuration of the logic cell 11, a plurality of input ports may be provided or a plurality of output ports may be provided. The input port and the output port are placed and routed like the port A1 and the port Y1. The same applies to the logic circuit 10.

Specific embodiments of the present invention will be described below using the semiconductor device 100 and the logic cell 10 as an example, and the same applies to the semiconductor device 101 and the logic cell 11.

<<Layout Example of Logic Cell 10>>

Figure 3A:
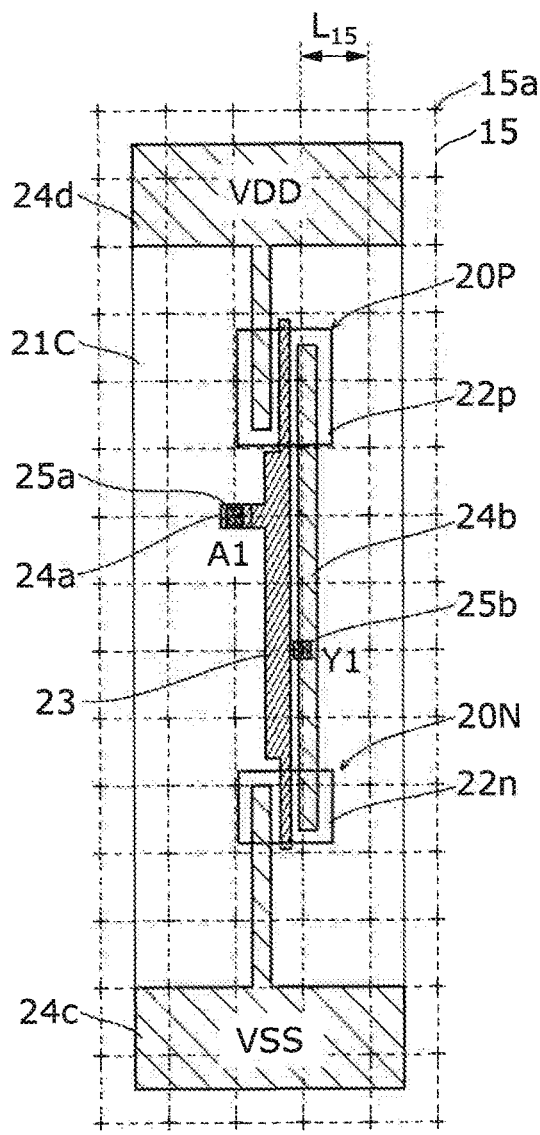
FIGS. 3A and 3B each illustrate a layout example of an inverter cell.
Figure 3B:
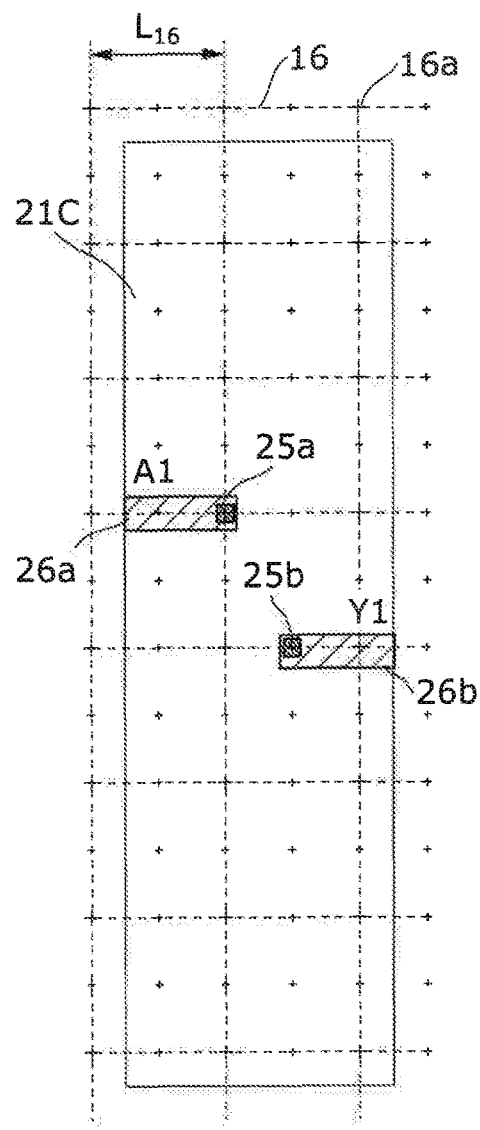
Figure 3B:
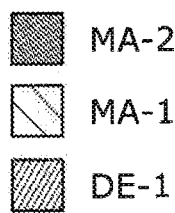
Figure 3B:
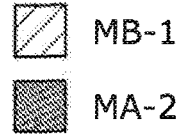

The layout of the logic cell 10 will be described using an inverter cell as an example. FIGS. 3A and 3B schematically illustrate the layout of the inverter cell 20. FIG. 3A illustrates the layout of a transistor 20P, a transistor 20N, and wirings of the wiring layers MA-1 and MA-2, and FIG. 3B illustrates the layout of wirings of the wiring layers MA-2 and MB-1. FIG. 3A also illustrates a wiring grid 15 and grid points 15a used in designing the element layer DE-1 and the wiring layers MA-1 and MA-2. FIG. 3B also illustrates a wiring grid 16 and grid points 16a used in designing the wiring layers MB-1 and MB-2. Note that $L_{15}$ and $L_{16}$ are grid intervals.

The transistor 20P is a p-channel transistor, and the transistor 20N is an n-channel transistor. In a region 21C, the inverter cell 20 is formed. Regions 22p and 22n and a wiring 23 are provided in the element layer DE-1. In the region 22p, the transistor 20P is formed, while in the region 22n, the transistor 20N is formed. The regions 22p and 22n include impurity regions forming sources and drains of the transistors 20P and 20N. Part of the wiring 23 forms gates of the transistors 20N and 20P.

The wirings 24a to 24d are provided in the wiring layer MA-1, the wirings 25a and 25b are provided in the wiring layer MA-2, and the wirings 26a and 26b are provided in the wiring layer MB-1. The transistor 20P and the transistor 20N are electrically connected in series through the wiring 26b. The wiring 24c forms a power supply line (VSS line) for supplying a low power supply potential VSS. The wiring 24d forms a power supply line (VDD line) for supplying a high power supply potential VDD.

The port A1 is formed using the wiring 26a. The wiring 26a is electrically connected to the wiring 23 through the wirings 24a and 25a. The port Y1 is formed using the wiring 26b. The wiring 26b is electrically connected to the wiring 24b through the wiring 25b. The wirings 25a, 24a, and 23 are provided so as to overlap with one common grid point 15a. Similarly, the wirings 25b and 24b are provided so as to overlap with one common grid point 15a.

Since the wiring layers MB-1 and MB-2 are stacked over the element layer DE-2, $L_{16}$ is larger than $L_{15}$ in some cases. In that case, $L_{16}$ can have the minimum value of the design rule for the element layer DE-2. In the case of such a design rule, however, the grid point 16a of the wiring layers MB-1 and MB-2 does not overlap with the grid point 15a of the wiring layers MA-1 and MA-2. This might decrease the efficiency of designing using an automatic placer and router.

Thus, in the case where $L_{16}$ is larger than $L_{15}$, $L_{16}$ is set to 1.5 times or 2 times as large as $L_{15}$. Here, $L_{16}$ is twice as large as $L_{15}$. With such a design rule, the wiring grid 15 includes the grid point 15a overlapping with the grid point 16a. Thus, enhancing the efficiency of designing using an automatic placer and router is compatible with reducing an area overhead of the semiconductor device 100. Furthermore, also in the case where a circuit composed of a combination of the logic cell 10 and the transistor DE2 is designed, such a design rule contributes to efficient designing.

<<Combination of Transistor DE2 and Logic Cell 10>>

The semiconductor device 100 can be provided with a circuit composed of a combination of one or more transistors DE2 and the logic cell 10. In the case where the transistor DE2 is an OS transistor, the off-state current of the OS transistor is extremely low; thus, the logic circuit 10a of the logic cell 10 can have another function or higher performance. FIGS. 4A to 4F each illustrate an example of a circuit composed of a combination of an OS transistor/OS transistors and a logic circuit. Transistors TO1 to TO3 and TO6 to TO8 in FIGS. 4A to 4F are OS transistors.

Here, an off-state current refers to a current that flows between a source and a drain when a transistor is off. In the case of an n-channel transistor, for example, when the threshold voltage of the transistor is approximately 0 V to 2 V, a current flowing between a source and a drain when a voltage between a gate and the source is negative can be referred to as an off-state current. An extremely low off-state current means, for example, that the off-state current per micrometer of channel width is lower than or equal to 100 zA (z represents zepto and denotes a factor of $10^{-21}$). Since the off-state current is preferably as low as possible, the normalized off-state current is preferably lower than or equal to 10 zA/mm or lower than or equal to 1 zA/mm), more preferably lower than or equal to 10 yA/mm (y represents yocto and denotes a factor of $10^{-24}$).

An oxide semiconductor has a bandgap of 3.0 eV or higher, thus, an OS transistor has a low leakage current due to thermal excitation and, as described above, an extremely low off-state current. A channel formation region of an OS transistor is preferably formed using an oxide semiconductor containing at least one of indium (In) and zinc (Zn). Typical examples of such an oxide semiconductor include an In—Ga—Zn oxide and an In—Sn—Zn oxide. By reducing impurities serving as electron donors, such as moisture or hydrogen, and also reducing oxygen vacancies, an i-type (intrinsic) or a substantially i-type oxide semiconductor can be obtained. Here, such an oxide semiconductor can be referred to as a highly-purified oxide semiconductor. By using a highly purified oxide semiconductor, the off-state current of the OS transistor that is normalized by channel width can be as low as several yoctoamperes per micrometer to several zeptoamperes per micrometer. An OS transistor and an oxide semiconductor will be described in Embodiments 3 and 4.

Figure 4A:
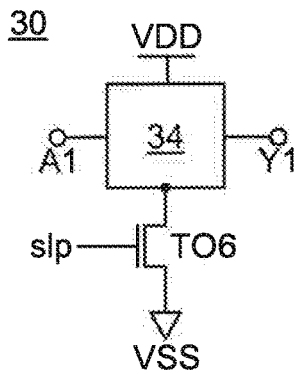
FIGS. 4A to 4F are circuit diagrams each illustrating a combination example of a logic circuit and an oxide semiconductor transistor (oxide semiconductor transistors).

A circuit 30 in FIG. 4A includes a logic circuit 34 and the transistor TO6. The logic circuit 34 corresponds to the logic circuit 10a of the logic cell 10. The transistor TO6 functions as a power switch for stopping supply of VSS. On/off of the transistor TO6 is controlled by a signal slp.

Figure 4B:
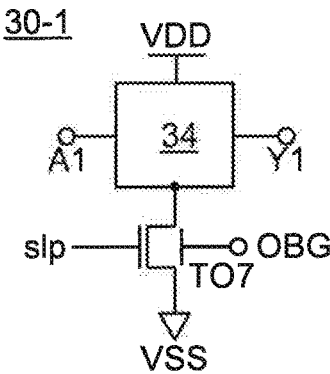
Figure 4C:
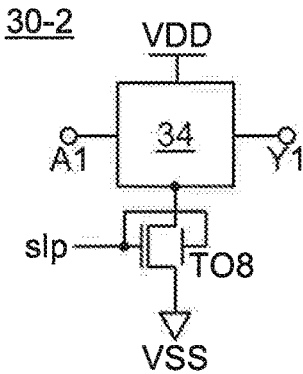

As illustrated in FIGS. 4B and 4C, the transistor TO6 may be provided with a back gate. In a circuit 30-1 in FIG. 4B, a back gate of a transistor TO7 is electrically connected to a port OBG. The threshold voltage of the transistor TO7 can be controlled by the potential of the port OBG. In the case where a charge storage layer is provided over an insulating layer between the back gate and a channel formation region of the transistor TO7, in fabricating the circuit 30-1, a step of introducing charge into a charge storage layer of the transistor TO7 can be performed with the use of the port OBG. In the case where the step is performed, the circuit 30-1 can be operated with the back gate of the transistor TO7 brought into an electrically floating state without control of the potential of the port OBG.

In a circuit 30-2 in FIG. 4C, a back gate of the transistor TO8 is electrically connected to a gate thereof. Such a device structure can improve the on-state current characteristics of the transistor TO8. Note that the back gate of the transistor TO8 may be electrically connected to a source or a drain thereof.

Figure 4D:
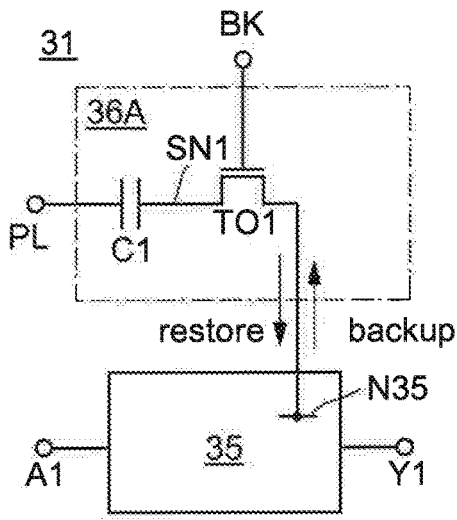
Figure 4E:
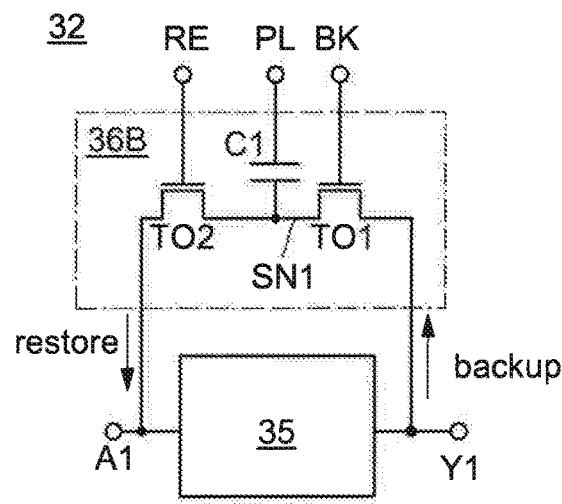
Figure 4F:
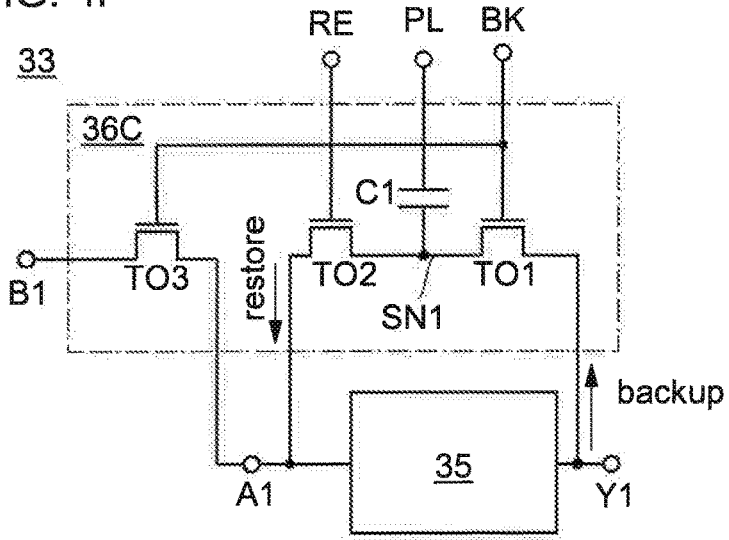

FIGS. 4D to 4F each illustrate an example of a circuit composed of a combination of a logic circuit and a backup circuit using an OS transistor/OS transistors. Providing the circuit for backing up data (state) of the logic circuit enables power gating of a semiconductor device including the logic circuit. The backup circuit described below can retain data for a long time in clock gating and in power gating owing to the extremely low off-state current of the OS transistor/OS transistors.

A circuit 31 in FIG. 4D includes a logic circuit 35 and a backup circuit 36A. The logic circuit 35 corresponds to the logic circuit 10a of the logic cell 10. The backup circuit 36A includes a node SN1, the transistor TO1, and a capacitor C1. The backup circuit 36A has a configuration similar to that of a DRAM memory cell. The node SN1 is a storage node and brought into an electrically floating state when the transistor TO1 is turned off. The capacitor C1 is a storage capacitor for holding the potential of the node SN1 and is electrically connected to the node SN1 and the port PL. A gate of the transistor TO1 is electrically connected to a port BK. A signal for controlling the backup operation is input to the port BK. When the transistor TO1 is turned on, data of a node N35 is backed up or data held in the node SN1 is written to the node N35. The node N35 is an internal node, an input node, or an output node of the logic circuit 35.

A circuit 32 in FIG. 4E includes the logic circuit 35 and a backup circuit 36B. The backup circuit 36B is different from the backup circuit 36A in that the transistor TO2 is additionally provided. The transistor TO1 and the transistor TO2 are electrically connected in series, and when the transistors TO1 and TO2 are turned off, the node SN1 is brought into an electrically floating state. A gate of the transistor TO2 is electrically connected to a port RE. A signal for controlling the restoration operation is input to the port RE.

In the backup operation, the transistor TO1 is turned on, whereby data of the output node (port Y1) of the logic circuit 35 is written to the node SN1. In the restoration operation, the transistor TO2 is turned on, whereby data of the node SN1 is written to the input node (port A1) of the logic circuit 35. Note that a node of which data is backed up is either the internal node or the output node of the logic circuit 35. Furthermore, a node to which data is restored is either the internal node or the output node of the logic circuit 35.

A circuit 33 in FIG. 4F includes the logic circuit 35, a port B1, and a backup circuit 36C. The backup circuit 36C is different from the backup circuit 36B in that the transistor TO3 is additionally provided. The transistor TO3 is a pass transistor that controls the electrical continuity between the port B1 and the port A1. A gate of the transistor TO3 is electrically connected to the port BK.

Note that the transistors TO1 to TO3 may be provided with back gates like the transistors TO7 and TO8.

(Retention Time)

Since the transistors TO1 to TO3 are OS transistors, the backup circuits 36A to 36C can retain data for a long time. For example, in the case where a power supply voltage is in the range from 2V to 3.5 V, the storage capacitance of the node SN1 (capacitance of C1) is 21 fF, and the allowable variation in the held potential of the node SN1 is less than 0.5 V in the backup circuit 36A, the leakage current from the node SN1 needs to be less than $33 \times 10^{-24}$ A so that the variation in the held potential for 10 years at 85° C. is less than the allowable variation. In the case where the leakage current of other components is lower than the above and a leakage current flows almost exclusively in the transistor TO1, the transistor TO1 with a channel width of 350 nm preferably has a leakage current per channel width of lower than $93 \times 10^{-24}$ A/μm. That is, the use of an OS transistor as the transistor TO1 allows the backup circuit 36A to retain data for 10 years at 85° C.

In storage circuits that utilize the off-state current characteristics of an OS transistor, for example, the backup circuits 36A to 36C, a predetermined potential keeps being supplied to the OS transistor in a retention period in some cases. For example, a potential that completely turns off the OS transistor may keep being supplied to a gate of the OS transistor. Alternatively, a potential that makes the OS transistor in a normally-off state may keep being supplied to a back gate of the OS transistor. In such a case, the voltage is supplied to the storage circuit in the retention period. However, little power is consumed because almost no current flows. Because of little power consumption, even if a predetermined voltage is applied to the storage circuit, the storage circuit using the OS transistor can be regarded as being substantially nonvolatile.

<<Example of Layered Structure of Semiconductor Device 100>>

Figure 5:
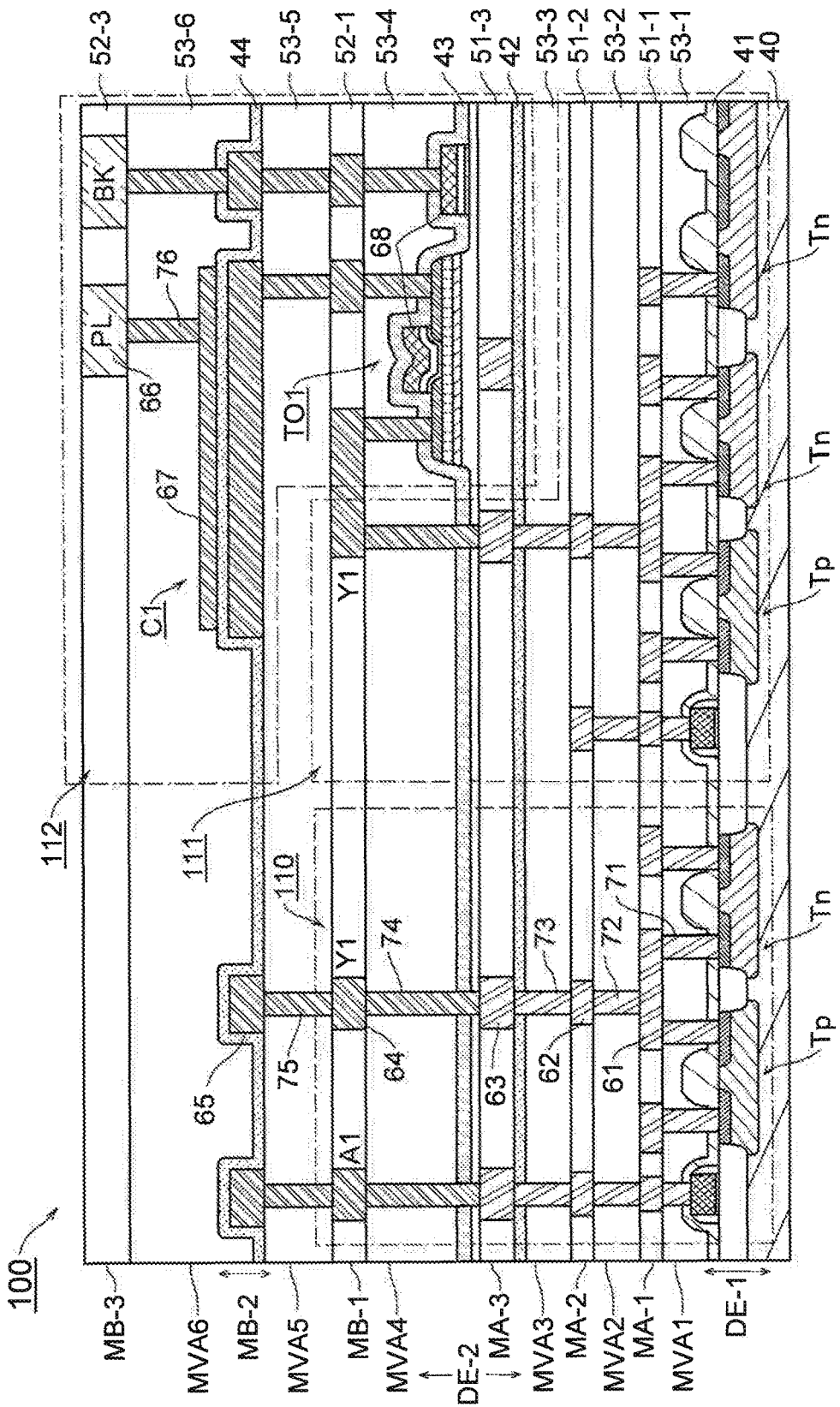
FIG. 5 is a cross-sectional view schematically illustrating a layered structure of a semiconductor device.

FIG. 5 schematically illustrates a layered structure of the semiconductor device 100. A logic cell 110, a logic cell 111, and a circuit 112 are illustrated in FIG. 5. The circuit 112 is stacked over the logic cell 111. The circuit 112 corresponds to each of the backup circuits illustrated in FIGS. 4C to 4E and is connected to the logic cell 111 so that data in the logic cell 111 can be backed up. The transistor TO1 and the capacitor C1 provided in the circuit 112 are illustrated in FIG. 5.

The semiconductor device 100 in FIG. 5 is formed in and over a single crystal silicon wafer 40. A plurality of Si transistors Tp and a plurality of Si transistors Tn are formed in the element layer DE-1. These Si transistors are covered with an insulating layer 41. The logic cell 110 is an inverter cell. The logic cell 111 is a logic circuit in which an output node of an inverter is electrically connected to the port Y1. Here, the Si transistor Tp is a p-channel transistor, and the Si transistor Tn is an n-channel transistor.

In each of layers MVA1 to MVA6, a plug for the connection between a conductor in an upper layer and a conductor in a lower layer is formed. The layers MVA1 to MVA6 include a plurality of plugs 71 to 76 provided in insulating layers 53-1 to 53-6.

The wiring layers MA-1 and MA-2 include a plurality of wirings 61 and 62 provided in the insulating layers 51-1 and 51-2, respectively. The wiring layers MB-1 to MB-3 include a plurality of wirings 64 to 66, respectively. The wirings 64 and 66 are provided in the insulating layers 52-1 and 52-3, respectively. The wiring 65 is formed over the insulating layer 53-5. The wiring 65 is covered with an insulating layer 44.

In the circuit 112, a wiring 67 overlapping with the wiring 65 with the insulating layer 44 therebetween is provided, whereby the capacitor C1 is formed. Note that an electrode of the capacitor C1 is not limited to an electrode formed in the wiring layer MB-2. The electrode of the capacitor C1 needs to be formed in any of the wiring layers included in the semiconductor device 100. The ports PL and BK are provided in the wiring layer MB-3. A gate (wiring 68) of the transistor TO1 is connected to the port BK.

Although an example in which three wiring layers are provided over the element layer DE-2 is described here, this example is not necessarily employed. Two or more wiring layers need to be provided over the element layer DE-2.

A plurality of OS transistors are formed in the element layer DE-2. The OS transistor is formed over an insulating layer 42 and is covered with an insulating layer 43. The insulating layers 42 and 43 are passivation layers for the OS transistors. In FIG. 5, the transistor TO1 among the OS transistors provided in the element layer DE-2 is illustrated. The transistor TO1 has a device structure similar to that of the OS transistor 800 (FIGS. 14A to 14D) described in Embodiment 3. An OS transistor with a back gate is provided in the element layer DE-2; thus, the element layer DE-2 includes the wiring layer MA-3 provided with the back gate. The wiring layer MA-3 includes a plurality of wirings 63 provided in an insulating layer 51-3.

In FIG. 5, the port A1 and the port Y1 of the logic cell 110 are connected to the wiring 65 through a plug 75. In the case where the wiring layer MA-3 is provided, a wiring for connecting logic circuits composed of the layers (DE-1, MA-1, and MA-2) in the logic cells 110 and 111 to an input port and an output port can also be provided in the wiring layer MA-3.

In FIG. 5, the conductor having high heat resistance (e.g., tungsten) is used for the wirings 61 to 63 and the plugs 71 to 73. Meanwhile, for the wirings 64 to 67 and the plugs 74 to 76, which are formed after the element layer DE-2, a conductor having a lower melting point and lower resistivity than the wiring 61 and the like (e.g., Cu or Al) is preferably used.

Figure 17A:
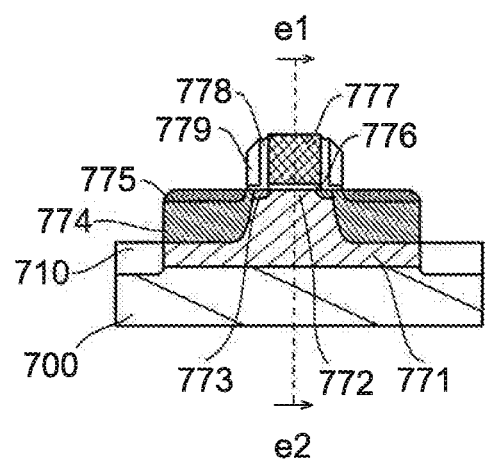
FIGS. 17A and 17B are cross-sectional views illustrating a structural example of a transistor.
Figure 17B:
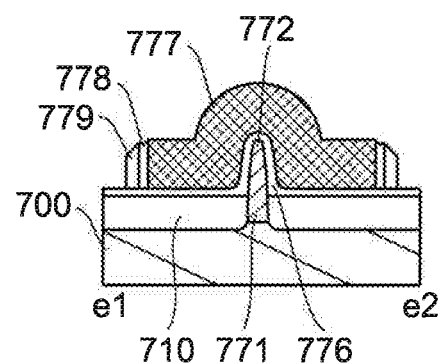

The transistors Tp and Tn of the element layer DE-1 are, but not limited to, planar type transistors. The transistor Tp and Tn may have three-dimensional structures (e.g., a FIN-type structure or a Tri-Gate type structure). FIGS. 17A and 17B illustrate an example of a FIN-type transistor. FIG. 17A is a cross-sectional view of the transistor in the channel length direction, and FIG. 17B is a cross-sectional view along e1-e2 in FIG. 17A.

In the transistor illustrated in FIGS. 17A and 17B, an active layer (also referred to as a channel formation region) 772 has a projected shape, and a gate insulating layer 776 and a gate electrode 777 are provided along the side surfaces and top surface thereof. Reference numeral 710 denotes an element isolation layer. Reference numerals 771, 773, 774 denote a well, a low concentration impurity region, and a high concentration impurity region, respectively. Reference numeral 775 denotes a conductive region. Reference numerals 778 and 779 denote sidewall insulating layers. Although FIGS. 17A and 17B illustrate the case where a projection is formed by processing a single crystal silicon wafer 700, a semiconductor region with a projected shape can be formed by processing an SOI substrate.

<<Configuration Example of Processing Unit>>

Figure 6:
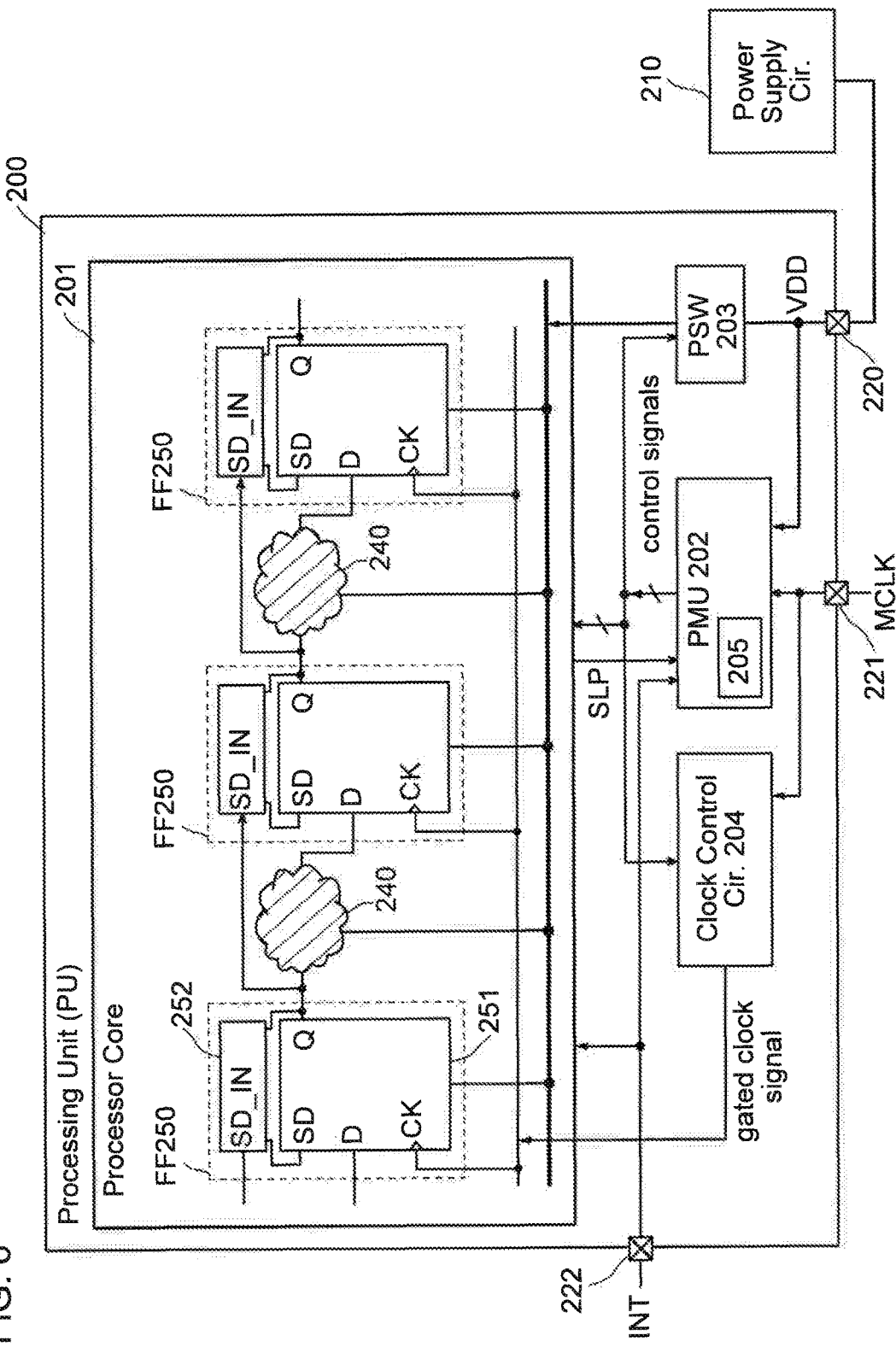
FIG. 6 is a block diagram illustrating a configuration example of a processing unit.

Here, a processing unit will be described as a specific example of a semiconductor device designed using logic cells as elements. A semiconductor device in FIG. 6 includes a processing unit (PU) 200 and a power supply circuit 210. The PU 200 has a function of executing an instruction. The PU 200 includes a plurality of functional circuits integrated on one chip. The PU 200 further includes a processor core 201, a power management unit (PMU) 202, a power switch (PSW) 203, and a clock control circuit 204. FIG. 6 illustrates an example in which the power supply circuit 210 is provided on a chip different from a chip on which the PU 200 is provided. A terminal 220 is a power supply potential terminal, and a power supply potential VDD is input from the power supply circuit 210 to the terminal 220. Terminals 221 and 222 are signal input terminals. A master clock signal MCLK is input to the terminal 221. A signal INT is input to the terminal 222. The signal INT is an interrupt signal for requesting interrupt processing. The signal INT is input to the processor core 201 and the PMU 202 in the PU 200.

<Processor Core>

The processor core 201 is capable of executing an instruction and can also be referred to as an arithmetic processing circuit or a processor (processing unit). The processor core 201 contains a logic cell as a basic element. The processor core 201 includes a logic circuit 240, a flip-flop (FF) 250, and the like, and a variety of functional circuits are formed using these circuits. For example, the logic circuit 240 can be a combinational circuit. The FF 250 is included in a register.

The FF 250 includes a scan flip-flop (SFF) 251 and a backup circuit 252. The SFF 251 is composed of a logic cell. The backup circuit 252 is a circuit for backing up data of the SFF 251. That is, the FF 250 can be called a scan flop-flop having a backup function. A port Q of the FF 250 is electrically connected to an input terminal of the logic circuit 240 and is also electrically connected to a port SD_IN of another FF 250 to form a scan chain. Providing the FF 250 enables clock gating and power gating of the processor core 201; thus, the power consumption of the PU 200 can be reduced.

Figure 7:
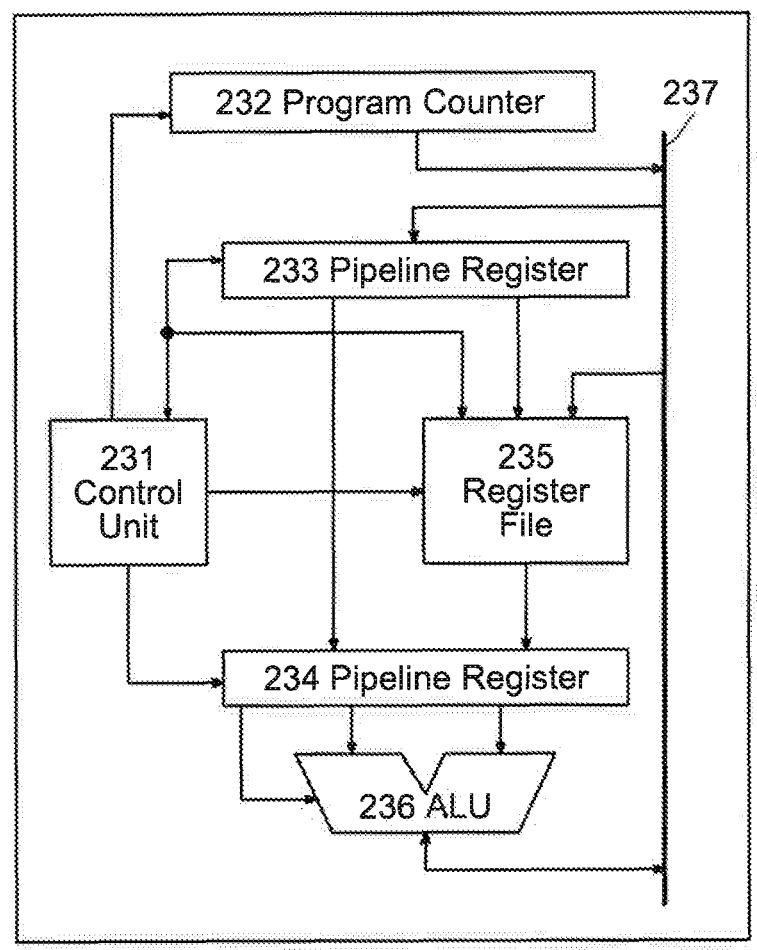
FIG. 7 is a block diagram illustrating a configuration example of a processor core.

FIG. 7 illustrates a configuration example of the processor core 201. The processor core 201 in FIG. 7 includes a control unit 231, a program counter 232, a pipeline register 233, a pipeline register 234, a register file 235, an arithmetic logic unit (ALU) 236, and a data bus 237. Data is transmitted between the processor core 201 and a peripheral circuit such as the PMU 202 or a cache through the data bus 237.

The control unit 231 has a function of decoding and executing instructions contained in a program such as input applications by controlling the overall operations of the program counter 232, the pipeline register 233, the pipeline register 234, the register file 235, the ALU 236, and the data bus 237. The ALU 236 has a function of performing a variety of arithmetic operations such as four arithmetic operations and logic operations. The program counter 232 is a register having a function of storing the address of an instruction to be executed next.

The pipeline register 233 has a function of temporarily storing instruction data. The register file 235 includes a plurality of registers including a general-purpose register and can store data read from a main memory, data obtained as a result of arithmetic operations in the ALU 236, or the like. The pipeline register 234 has a function of temporarily storing data used for arithmetic operations performed in the ALU 236, data obtained as a result of arithmetic operations in the ALU 236, or the like.

<Circuit Configuration Example of Flip-Flop>

Figure 8:
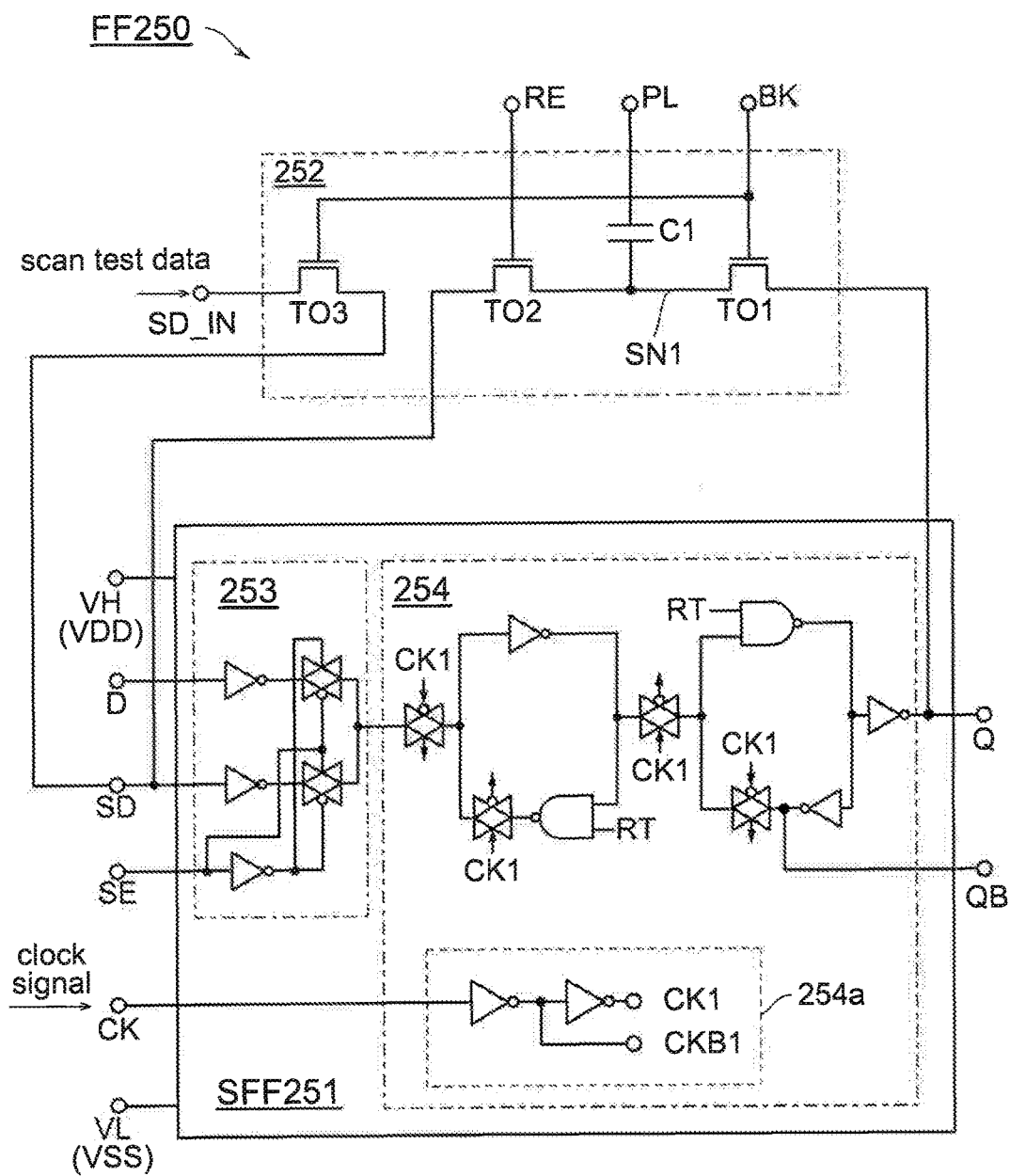
FIG. 8 is a circuit diagram illustrating a configuration example of a flip-flop.

FIG. 8 is a circuit configuration example of the FF 250. The backup circuit 252 in FIG. 8 has a configuration similar to that of the backup circuit 36C. The SFF 251 in FIG. 8 includes a selector (SEL) 253, an FF 254, and ports VH, VL, D, Q, QB, SD, SD_IN, SE, CK, and RT.

The port VH is a power supply port for high power supply voltage VDD, and the port VL is a power supply port for low power supply voltage VSS. VDD and VSS are applied to inverters of the SEL 253, and inverters and NAND circuits (hereinafter referred to as NAND) of the FF 254. VDD is input to the port VH through a power switch.

The ports D and SD are data input ports of the SFF 251. The port D is electrically connected to a data output port of a logic circuit (e.g., a combinational circuit), and data is input to the port D. Restore data or scan test data is input to the port SD through the backup circuit 252. The port Q is an output port. The port Q is electrically connected to a port SD_IN of another FF 250 and a data input port of the logic circuit. The port QB outputs data whose logic is inverted from the logic of the port Q. The port QB is electrically connected to a data input port of another logic circuit. The port QB is provided as necessary.

The ports SE, CK, and RT are input ports for control signals. A scan enable signal is input to the port SE. The port SE is electrically connected to the SEL 253. A clock signal is input to the port CK. The port CK is electrically connected to a circuit 254a. A reset signal is input to the port RT. The port RT is electrically connected to the NAND of the FF 254.

The SEL 253 has a function of selecting one of the ports D and SD in accordance with the logic of the port SE and inputting data of the selected port to the FF 254. When a scan test is performed, the logic of the port SE is set to "H" so that data of the port SD is input to the FF 254. When the FF 250 normally operates, the logic of the port SE is set to "L", and the port D is electrically connected to the input port of the FF 254.

The FF 254 in FIG. 8 includes a master latch circuit and a slave latch circuit. The circuit 254a is a circuit for inputting clock signals, which includes ports CK1 and CKB1. The port CK1 outputs a non-inverted clock signal. The port CKB1 outputs an inverted clock signal. An analog switch of the FF 254 is electrically connected to the ports CK1 and CKB1.

<Operation Example of Scan Flip-Flop>

Figure 9:
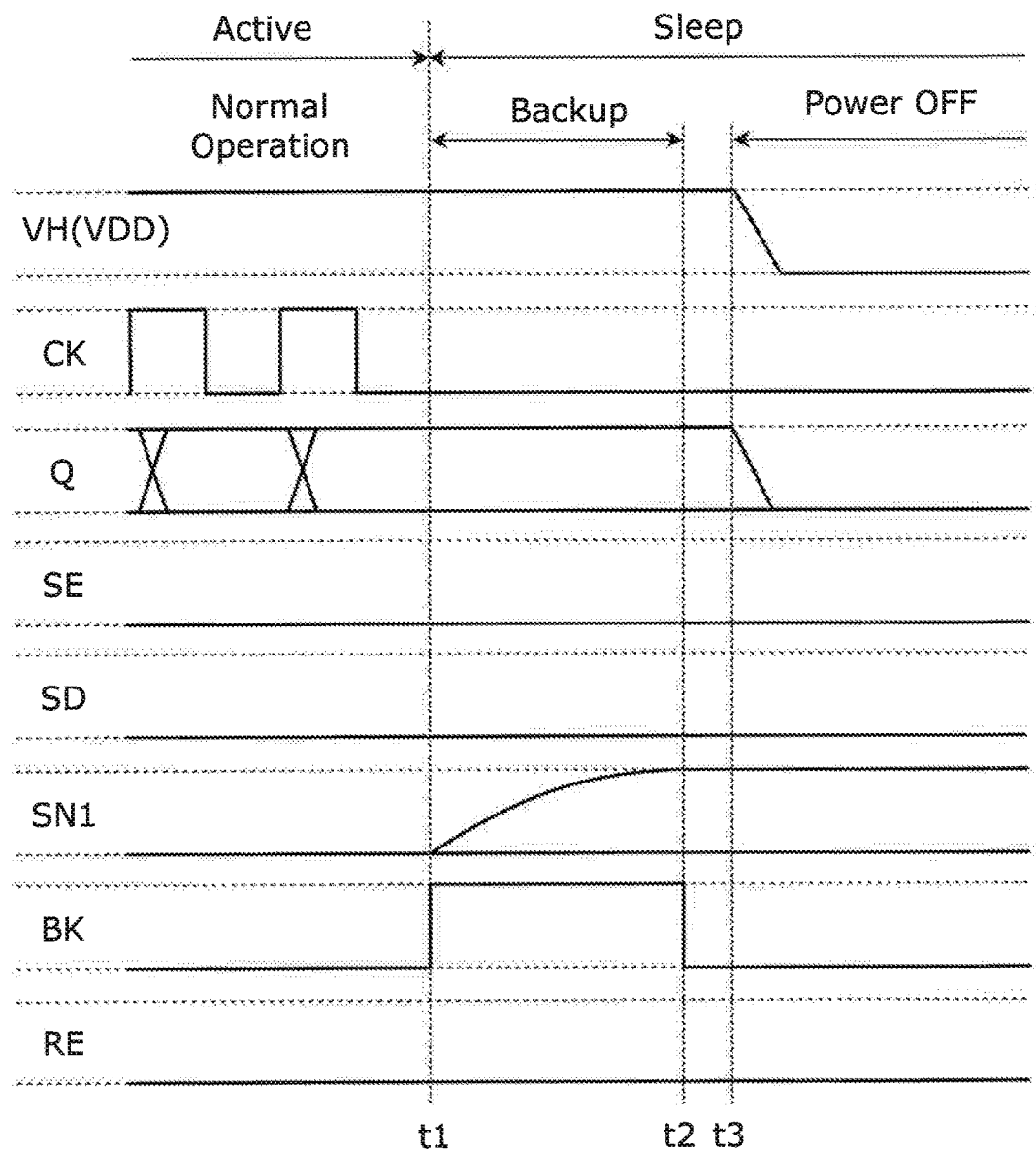
FIG. 9 is a timing chart showing an operation example of a flip-flop.
Figure 10:
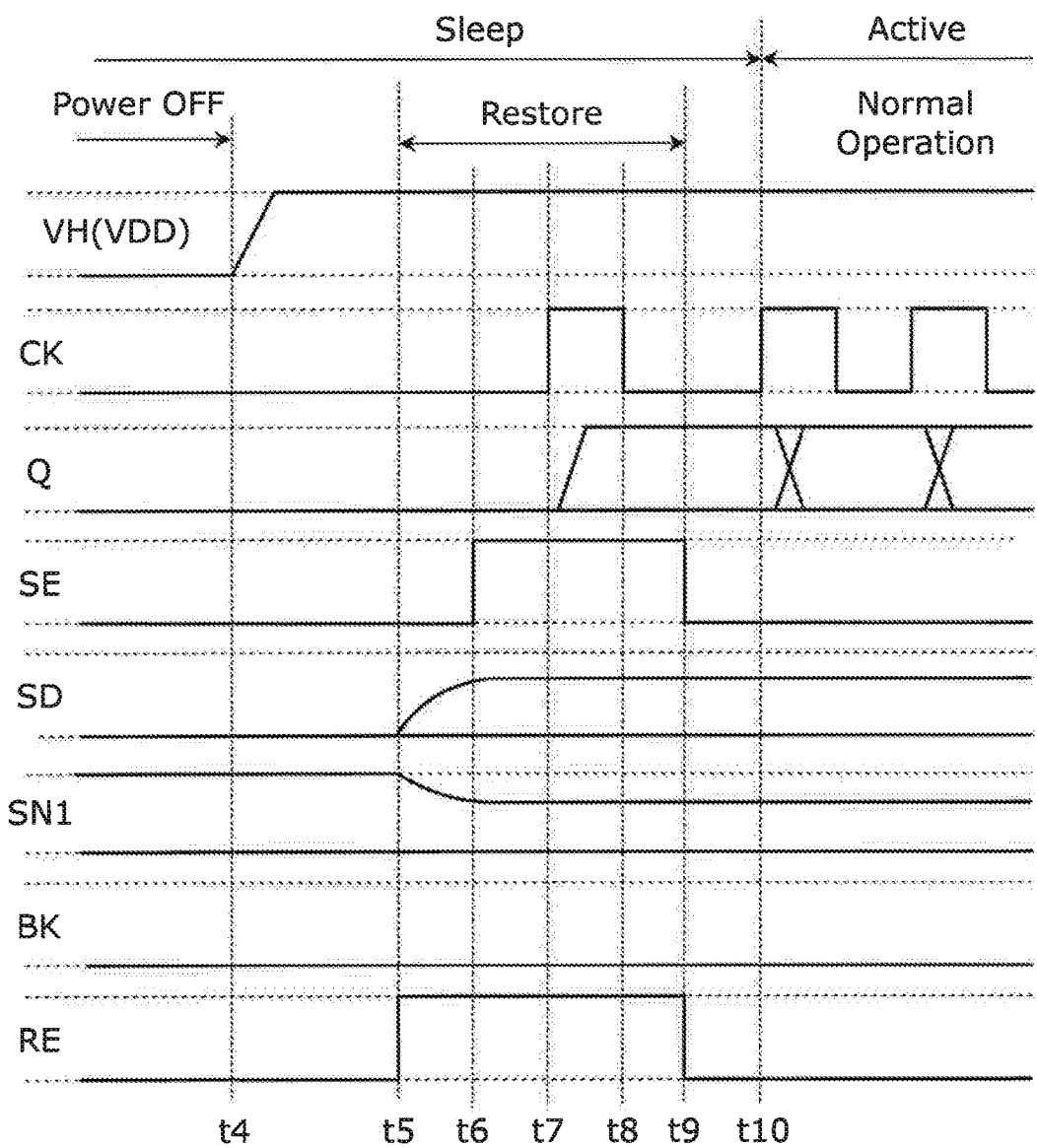
FIG. 10 is a timing chart showing an operation example of a flip-flop.

FIG. 9 and FIG. 10 are timing charts each illustrating an operation example of the FF 250. FIG. 9 illustrates an operation example of the FF 250 when the PU 200 is transferred from an active mode to a sleep mode. FIG. 10 illustrates an operation example of the FF 250 when the PU 200 is transferred from the sleep mode to the active mode. FIG. 9 and FIG. 10 illustrate changes in the voltages (logics) of the ports VH, CK, Q, SE, SD, BK, and RE, and the node SN1. VSS is input to the port PL. In FIG. 9 and FIG. 10, the maximum voltage is VDD and the minimum voltage is VSS.

<Active Mode (Normal Operation Mode)>

In the active mode, the FF 250 performs normal operation. The FF 250 functions as a flip-flop that temporarily retains data output from the logic circuit. Here, data output from the logic circuit is input to the port D. In normal operation, the ports RE and BK are at "L" and the transistors TO1 to TO3 are off. The port SE is at "L," and data of the port D is input to the FF 254 by the SEL 253. The port RT is at "H." A clock signal is input to the port CK. In conjunction with the change of the port CK into "H," the voltage (logic) of the port Q is changed.

<Scan Mode>

In the scan mode, a plurality of SFFs 251 are electrically connected in series to form a scan chain. In the backup circuit 252, the transistors TO1 and TO3 are turned on and the transistor TO2 is turned off. Since the port SE is at "H," data of the port SD is input to the FF 254 by the SEL 253. In other words, in the scan mode, data output from the port Q of the FF 250 is input to the port SD of the FF 250 in the next stage.

(Scan Test)

In order to perform the scan test, the mode is set to the scan mode, and the scan test data is input to the port SD_IN of the FF 250 in the first stage of the scan chain. The shift operation of the scan chain is performed by input of a clock signal, and the scan test data is written to each FF 250. Next, the FF 250 performs normal operation to retain data output from the logic circuit 240. The mode is set to the scan mode again to perform the shift operation of the scan chain. Whether the logic circuit 240 and the FF 250 fail to operate properly can be determined from data output from the port Q of the FF 250 in the last stage.

(Backup Sequence)

Backup sequence is performed by transfer from the active mode to the sleep mode. In the backup sequence, clock gating (clock stop), data backup, and power gating (power-off) are performed. The mode is set to the sleep mode by stopping supply of clocks.

In the example of FIG. 9, clock gating of the FF 250 is started at t1, and backup operation is started in the backup circuit 252. Specifically, the port CK is set to "L" and the port BK is set to "H" at t1. A period during which the port BK is at "H" is a backup operation period.

When the port BK is set to "H," the transistor TO1 electrically connects the node SN1 to the port Q. Thus, the node SN1 remains at "L" when the port Q is at "0," and the voltage of the node SN1 rises to "H" when the port Q is at "1." In other words, in the period during which the port BK is at "H," the logic of the node SN1 can be the same as the logic of the port Q. The period during which the port BK is at "H" may be determined so that the voltage of the node SN1 rises to a "1" logical level. At t2, the port BK is set to "L" to turn off the transistors TO1 and TO3, so that the node SN1 becomes in an electrically floating state and the backup circuit 252 retains data.

At t3, the power is turned off to set the port RT to "L". The voltage of the port VH gradually drops from VDD to VSS. The power may be turned off at t2. Furthermore, the power is turned off as necessary. Depending on the power domain of the PU 200, the sleep mode time, or the like, power required to return from the sleep mode to the active mode might be higher than power that can be reduced by power-off. In that case, the effect of power gating cannot be obtained; thus, in the sleep mode, it is preferable that the power be not turned off and only supply of clock signals be stopped.

(Restore Sequence)

In a restore sequence where the mode is transferred from the sleep mode to the active mode, power is turned on, data is restored, and clocks are supplied. The mode is transferred to the active mode by starting supply of clocks.

The power is turned on at t4. The voltage of the port VH gradually increases from VSS to VDD. Restoration operation is started after the port VH becomes at VDD. The ports SE and RE are set to "H" at t5. In addition, the port RT is set to "H". Restoration operation is performed while the port RE is at "H". The transistor TO2 is turned on and the node SN1 is connected to the port SD. When the node SN1 is at "L," the port SD remains at "L." When the node SN1 is "H," the voltage of the port SD increases to "H." The port SE is set to "H" at t6. The port SD is electrically connected to the input port of the FF 254 by the SEL 253. In other words, data retained in the node SN1 is written to the port SD.

Note that at t5, the port SE as well as the port RE can be set to "H". As illustrated in FIG. 10, in the case where the node SN1 is at "H," the port SE is preferably set to "H" after the voltage of the port SD rises to the "1" logical level. This driving prevents flow-through current from flowing through the FF 250.

After the logic of the port SD becomes the same as the logic of the node SN1, the port CK is at "H" for a certain period (from t7 to t8). In the example of FIG. 10, one clock is input to the port CK. When the port CK is set to "H" at t7, data of the master latch circuit is written to the slave latch. The port Q is set to "0" when the port SD is at "0" at t7, and the port Q is set to "1" when the port SD is at "1". In other words, data of the node SN1 is written to the port Q, and the FF 250 returns to a state immediately before clock gating is performed (i.e., the mode is set to the sleep mode). The restoration operation is terminated at t9 by setting the ports SE and RE to "L". The port D is electrically connected to the input port of the FF 254 by the SEL 253. In the backup circuit 252, the transistor TO3 is turned off and the node the node SN1 becomes in a floating state.

After SE and RE are set to "L," the input of a clock signal is restarted at t10 after a lapse of a certain period (e.g., one clock period) to set the FF 250 in the active mode. The FF 250 resumes normal operation.

As described above, the FF 250 is capable of backing up and restore data at high speed, and for example, is capable of completing backup operation and restoration operation within several clocks (2 to 5 clocks). In write operation of the backup circuit 252, the node SN1 is charged or discharged by switching operation of the transistors TO1 to TO3. In read operation of the backup circuit 252, the port SD is charged or discharged by switching operation of the transistors TO1 to TO3. Energy required for these operations is as low as energy required for a DRAM cell. There is no need to supply power to the backup circuit 252 for data retention; thus, standby power of the FF 250 can be reduced. Similarly, there is no need to supply power to the backup circuit 252 in normal operation; thus, providing the backup circuit 252 does not lead to a substantial increase in dynamic power of the FF 250.

Providing the backup circuit 252 adds parasitic capacitance of the transistor TO1 to the port Q. However, this parasitic capacitance is lower than the parasitic capacitance of a logic circuit connected to the port Q. Consequently, the normal operation of the FF 250 is not influenced, and providing the backup circuit 252 does not lead to a substantial decrease in the performance of the FF 250 in the active mode. In other words, the backup circuit 252 does not influence the operation of the PU 200.

<Power Management>

The PMU 202 has a function of controlling power gating, clock gating, and the like. Specifically, the PMU 202 is capable of controlling the processor core 201, the PSW 203, and the clock control circuit 204. The PMU 202 has a function of outputting control signals to be input to the ports BK, RE, and SE to the processor core 201.

The PMU 202 includes a circuit 205. The circuit 205 is capable of measuring time. The PMU 202 is capable of performing power management on the basis of data on time obtained by the circuit 205. For example, when the circuit 205 is a timer circuit, the PMU 202 may generate a timer interrupt request signal. The circuit 205 is provided as necessary.

The PSW 203 is capable of controlling supply of VDD to the PU 200 in response to a control signal of the PMU 202. In the example of FIG. 6, the processor core 201 may include a plurality of power domains. In that case, supply of power to the plurality of power domains may be controlled independently by the PSW 203. In addition, the processor core 201 may include a power domain that is not power-gated. In that case, VDD may be applied to this power domain without passing through the PSW 203.

The clock control circuit 204 has a function of generating and outputting a gated clock signal from the signal MCLK. The clock control circuit 204 is capable of stopping supply of a clock signal to the processor core 201 in response to a control signal of the PMU 202. The power supply circuit 210 may be capable of changing the magnitude of VDD in response to a control signal of the PMU 202.

A signal SLP is output from the processor core 201 to the PMU 202. The signal SLP is a trigger signal for transferring the processor core 201 to the sleep mode. In the processor core 201, the backup sequence of the FF 250 is executed in response to the signal SLP. When the signal SLP is input to the PMU 202, the PMU 202 outputs a control signal for transition from the active mode to the sleep mode to a functional circuit to be controlled. The PMU 202 controls the clock control circuit 204 and stops supply of a clock signal to the processor core 201. In addition, the PMU 202 controls the PSW 203 and stops supply of power to the processor core 201.

Processing for returning the processor core 201 from the sleep mode to the active mode is executed by input of the signal INT. In the processor core 201, the restore sequence of the FF 250 is executed in response to the signal INT. When the signal INT is input to the PMU 202, the PMU 202 outputs a control signal for transition from the sleep mode to the active mode to a functional circuit to be controlled. The PMU 202 controls the PSW 203 and restarts supply of power to the processor core 201. In addition, the PMU 202 controls the clock control circuit 204 and restarts supply of a clock signal to the processor core 201.

The backup sequence may be executed using the signal INT or an interrupt request signal of the PMU 202 as a trigger. Furthermore, the restore sequence may be executed using the interrupt request signal of the PMU 202 as a trigger.

<<Device Structure of PU 200 (FF 250)>>

Figure 11:
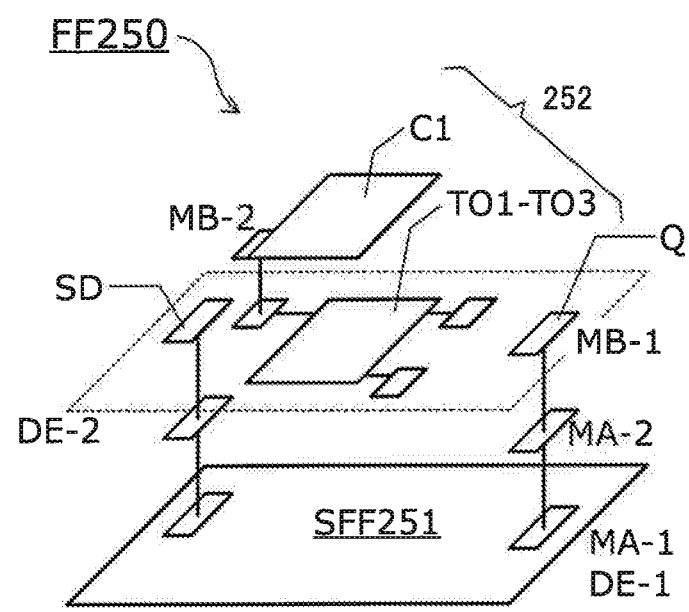
FIG. 11 schematically illustrates a device structure example of a flip-flop.

The PU 200 is a device having a layered structure similar to that of the semiconductor device 100 in FIG. 5. FIG. 11 is a schematic diagram illustrating the device structure of the FF 250. The SFF 251 is composed of a logic cell. Transistors of the SFF 251 are provided in the element layer DE-1 and are connected through wirings of the wiring layer MA-1. The ports SD and Q are provided in the wiring layer MB-1 and are connected to the SFF 251 through wirings of the wiring layer MA-2. The same applies to the ports SD_IN and D. The transistors TO1 to TO3 of the backup circuit 252 are provided in the element layer DE-2. One of a pair of electrodes of the capacitor C1 is provided in the wiring layer MB-2.

The number of elements in the backup circuit 252 is much smaller than the number of elements in the SFF 251; thus, there is no need to change the circuit configuration of the logic cell composing the SFF 251 in order to stack the backup circuit 252. In other words, the backup circuit 252 is a backup circuit that has very broad utility. Furthermore, the PU 200 can be designed efficiently.

The backup circuit 252 consumes almost no power in normal operation and requires significantly low power for backup operation and restoration operation. Thus, the FF 250 provided with the backup circuit 252 is highly suitable for normally-off computing. Even when the FF 250 is included, the dynamic power of the PU 200 can hardly be increased and the performance of the PU 200 can hardly be decreased. Thus, the PU 200 including the FF 250 can reduce power consumption effectively by power gating while keeping the performance.

Embodiment 2

In this embodiment, an electronic component and electronic devices and the like including the electronic component will be described as examples of semiconductor devices.

<Electronic Component>

Figure 12A:
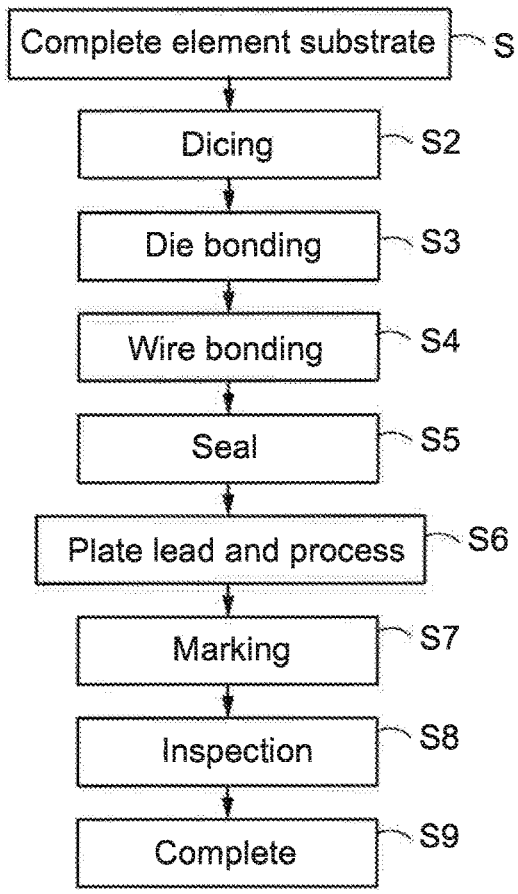
FIG. 12A is a flow chart showing an example of a method for manufacturing an electronic component.

FIG. 12A is a flow chart showing an example of a method for fabricating an electronic component. The electronic component is also referred to as a semiconductor package or an IC package. This electronic component has a plurality of standards and names depending on a terminal extraction direction and a terminal shape. Examples of the electronic component will be described in this embodiment.

A semiconductor device including a transistor is completed using detachable components integrated on a printed wiring board through an assembly process (post-process). The post-process can be finished through steps in FIG. 12A. Specifically, after an element substrate obtained in the preceding process is completed (Step S1), a dicing step for separating the substrate into a plurality of chips is performed (Step S2). The rear surface of the substrate is ground before Step S2. The substrate is thinned in this step to reduce warpage or the like of the substrate in the preceding process and to reduce the size of the component.

The divided chips are separately picked up to be mounted on and bonded to a lead frame in a die bonding step (Step S3). In the die bonding step, the chip is bonded to the lead frame by an appropriate method depending on a product, for example, bonding with a resin or a tape. In the die bonding step, the chip may be mounted on an interposer to be bonded. In a wire bonding step, lead of the lead frame is electrically connected to an electrode on the chip with a metal fine line (wire) (Step S4). A silver line or a gold line can be used as the metal fine line. Either ball bonding or wedge bonding can be used as wire bonding.

A molding step is performed to seal the wire bonded chip with an epoxy resin or the like (Step S5). With the molding step, the electronic component is filled with the resin. The lead of the lead frame is plated. After that, the lead is cut and processed (Step S6). This plating process prevents rust of the lead and facilitates soldering at the time of mounting the chip on a printed wiring board in a later step. Printing (marking) is performed on a surface of the package (Step S7). Through an inspection step (Step S8), the electronic component is completed (Step S9). When the electronic component includes the semiconductor device described in the above embodiment, low power consumption and reduction in size of the electronic component can be achieved.

Figure 12B:
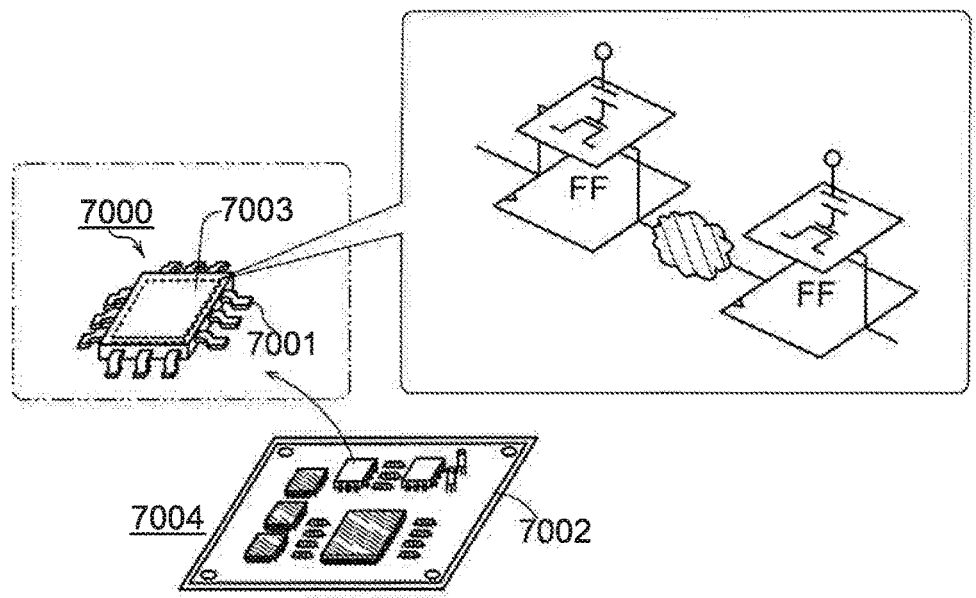
FIG. 12B is a perspective schematic diagram illustrating a structural example of the electronic component.

FIG. 12B is a schematic perspective view of the completed electronic component. FIG. 12B is a schematic perspective view illustrating a quad flat package (QFP) as an example of the electronic component. As illustrated in FIG. 12B, an electronic component 7000 includes a lead 7001 and a circuit portion 7003. In the circuit portion 7003, various logic circuits such as the FFs described in Embodiment 1 are formed using a plurality of logic cells and the transistors DE2 of the element layer DE-2. The electronic component 7000 is mounted on a printed wiring board 7002, for example. When a plurality of electronic components 7000 are used in combination and electrically connected to each other over the printed wiring board 7002, the electronic components 7000 can be mounted on an electronic device. A completed circuit board 7004 is provided in the electronic device or the like. The electronic component 7000 can be used as, for example, a random access memory that stores data or a processing unit that executes a variety of processings, such as a CPU, a microcontroller unit (MCU), an FPGA, or a wireless IC. When an electronic device includes the electronic component 7000, the power consumption of the electronic device can be reduced. Alternatively, the electronic device can easily have a smaller size.

The electronic component 7000 can be used as an electronic component (IC chip) of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include display devices, personal computers (PC), image reproducing devices provided with recording media (devices which reproduce the content of recording media such as DVDs, Blu-ray discs, flash memories, and HDDs, and a device which includes a display portion for displaying images), cellular phones, game machines including portable game machines, portable data terminals, e-book readers, cameras (e.g., video cameras and digital still cameras), wearable display devices (e.g., head mounted display devices, goggle-type display devices, glasses-type display devices, armband display devices, bracelet-type display devices, and necklace-type display devices), navigation systems, audio reproducing devices (e.g., car audio systems and digital audio players), copiers, facsimiles, printers, multifunction printers, automated teller machines (ATMs), and vending machines. FIGS. 13A to 13F illustrate specific examples of such electronic devices.

Figure 13A:
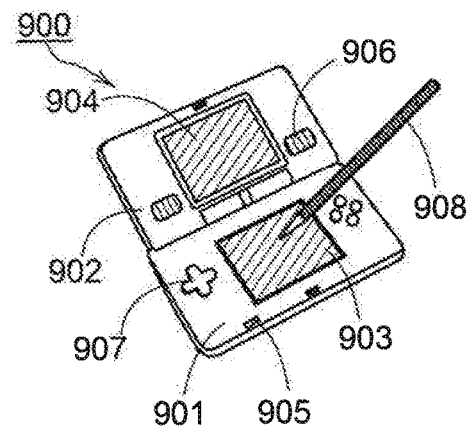
FIGS. 13A to 13F each illustrate a structural example of an electronic device.

A portable game machine 900 in FIG. 13A includes a housing 901, a housing 902, a display portion 903, a display portion 904, a microphone 905, a speaker 906, an operation key 907, a stylus 908, and the like.

Figure 13B:
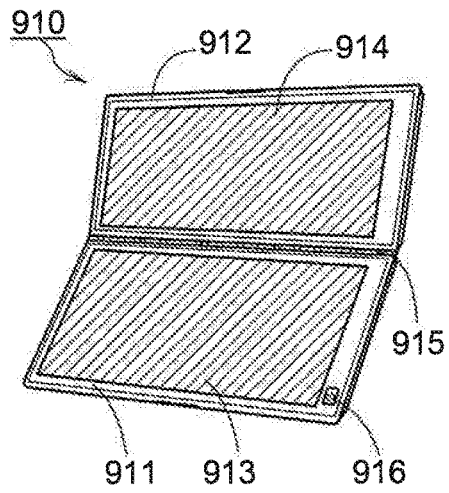

A portable information terminal 910 in FIG. 13B includes a housing 911, a housing 912, a display portion 913, a display portion 914, a joint 915, an operation key 916, and the like. The display portion 913 is provided in the housing 911, and the display portion 914 is provided in the housing 912. The housings 911 and 912 are connected to each other with the joint 915, and an angle between the housings 911 and 912 can be changed with the joint 915. An image displayed on the display portion 913 may be switched in accordance with the angle between the housings 911 and 912 at the joint 915. A display device with a touch panel may be used as the display portion 913 and/or the display portion 914.

Figure 13C:
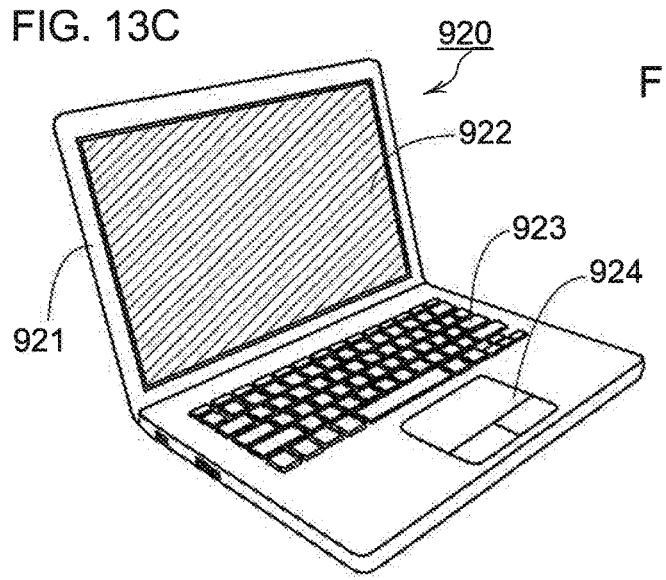

A laptop 920 in FIG. 13C includes a housing 921, a display portion 922, a keyboard 923, a pointing device 924, and the like.

Figure 13D:
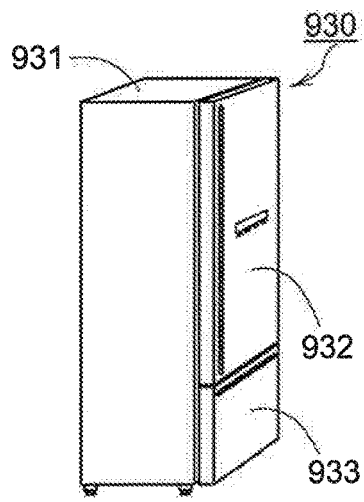

An electric refrigerator-freezer 930 in FIG. 13D includes a housing 931, a refrigerator door 932, a freezer door 933, and the like.

Figure 13E:
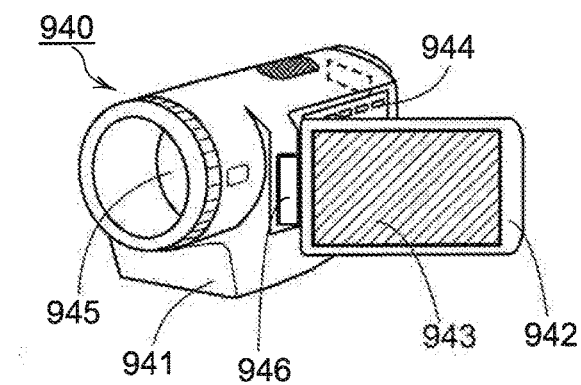

A video camera 940 in FIG. 13E includes a housing 941, a housing 942, a display portion 943, operation keys 944, a lens 945, a joint 946, and the like. The operation keys 944 and the lens 945 are provided in the housing 941, and the display portion 943 is provided in the housing 942. The housings 941 and 942 are connected to each other with the joint 946, and an angle between the housings 941 and 942 can be changed with the joint 946. The direction of an image displayed on the display portion 943 may be changed and display and non-display of an image may be switched in accordance with the angle between the housings 941 and 942, for example.

Figure 13F:
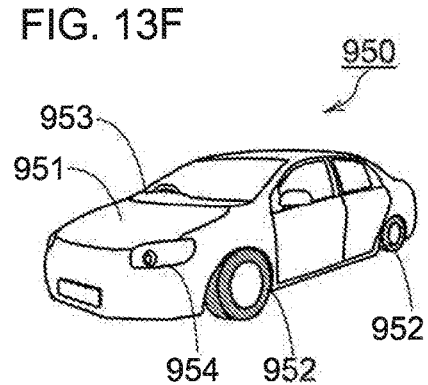

A motor vehicle 950 in FIG. 13F includes a car body 951, wheels 952, a dashboard 953, lights 954, and the like.

Embodiment 3

In this embodiment, an OS transistor and a semiconductor device including an OS transistor will be described.
<<Structural Example 1 of OS Transistor>>

Figure 14A:
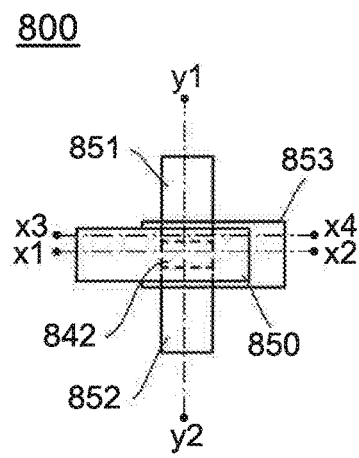
FIG. 14A is a top view illustrating a structural example of an OS transistor.
Figure 14B:
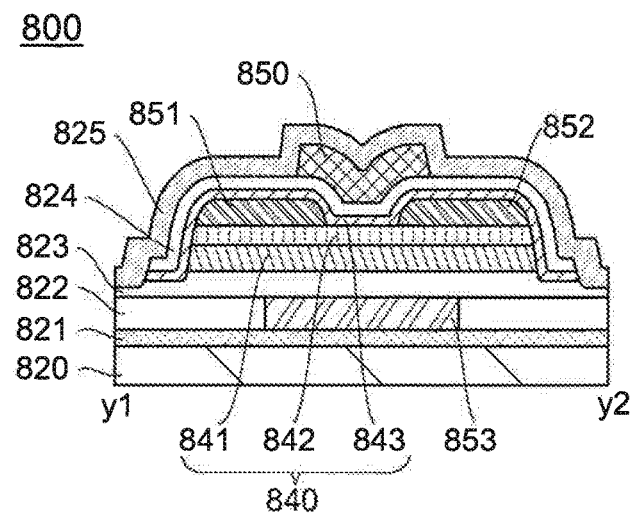
FIG. 14B is a cross-sectional view along y1-y2 in FIG. 14A.
Figure 14C:
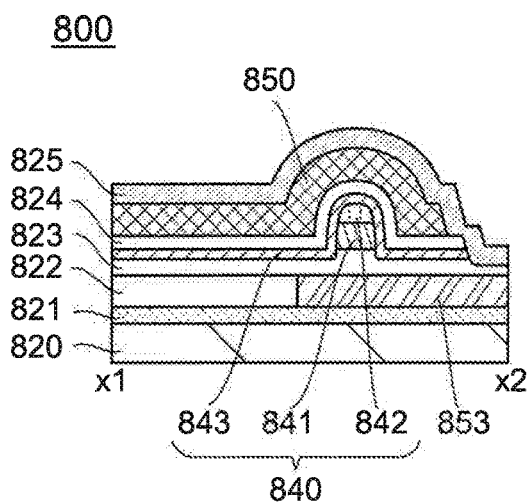
FIG. 14C is a cross-sectional view along x1-x2 in FIG. 14A.
Figure 14D:
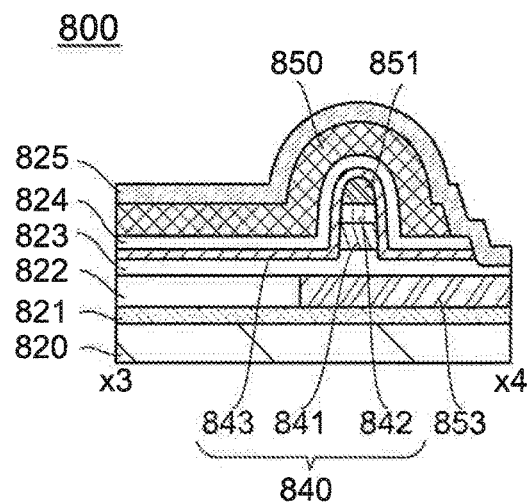
FIG. 14D is a cross-sectional view along x3-x4 in FIG. 14A.

FIGS. 14A to 14D illustrate a structural example of an OS transistor. FIG. 14A is a top view illustrating a structural example of an OS transistor. FIG. 14B is a cross-sectional view along y1-y2, FIG. 14C is a cross-sectional view along x1-x2, and FIG. 14D is a cross-sectional view along x3-x4. Here, in some cases, the direction of the line y1-y2 is referred to as the channel length direction, and the direction of the line x1-x2 is referred to as the channel width direction. Note that to clarify the device structure, some components are not illustrated in FIG. 14A.

An OS transistor 800 illustrated in FIGS. 14A to 14D includes a back gate. The OS transistor 800 is formed over an insulating surface, here, over an insulating layer 821. The insulating layer 821 is formed over a surface of the substrate 820. The insulating layer 821 has a function as a base layer of the OS transistor 800. The OS transistor 800 is covered with an insulating layer 825. Note that the insulating layers 821 and 825 can be regarded as components of the OS transistor 800. The OS transistor 800 includes an insulating layer 822, an insulating layer 823, an insulating layer 824, semiconductor layers 841 to 843, a conductive layer 850, a conductive layer 851, a conductive layer 852, and a conductive layer 853. Here, the semiconductor layers 841 to 843 are collectively referred to as a semiconductor region 840.

The conductive layer 850 functions as a gate electrode, and the conductive layer 853 functions as a back gate electrode. The conductive layers 851 and 852 function as a source electrode and a drain electrode. The insulating layer 821 has a function of electrically isolating the substrate 820 from the conductive layer 853. The insulating layer 824 serves as a gate insulating layer, and the insulating layer 823 serves as a gate insulating layer on the backchannel side.

The channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or in a region where a channel is formed in a top view of the transistor. In one transistor, channel lengths in all regions are not necessarily the same. In other words, the channel length of one transistor is not fixed to one value in some cases. Therefore, in this specification and the like, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is sometimes different from a channel width shown in a top view of a transistor (hereinafter referred to as an apparent channel width). For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, measuring an effective channel width is difficult in some cases. For example, to estimate an effective channel width from a design value, it is necessary to assume that the shape of a semiconductor region is known. Therefore, in the case where the shape of a semiconductor region is not known accurately, measuring an effective channel width accurately is difficult.

Thus, in this specification, in a top view of a transistor, an apparent channel width that is the length of a portion where a source and a drain face each other in a region where a semiconductor region and a gate electrode overlap with each other is referred to as a surrounded channel width (SCW) in some cases. Furthermore, in this specification, the term "channel width" may denote a surrounded channel width, an apparent channel width, or an effective channel width. Note that the values of a channel length, a channel width, an effective channel width, an apparent channel width, a surrounded channel width, and the like can be determined by obtaining and analyzing a cross-sectional TEM image and the like.

A surrounded channel width may be used to calculate the field-effect mobility, the current value per channel width, and the like of a transistor. In this case, the obtained value is sometimes different from the value obtained by using an effective channel width for the calculation.

As illustrated in FIGS. 14B and 14C, the semiconductor region 840 includes a portion in which the semiconductor layer 841, the semiconductor layer 842, and the semiconductor layer 843 are stacked in this order. The insulating layer 824 includes a region covering the stack portion. The conductive layer 850 overlaps with the stack region with the insulating layer 823 therebetween. The conductive layers 851 and 852 are provided over the stack formed of the semiconductor layers 841 and 843 and are in contact with a top surface of this stack and a side surface of the stack in the channel length direction. The stack of the semiconductor layers 841 and 842 and the conductive layers 851 and 852 are formed by etching using the same mask.

The semiconductor layer 843 is formed to cover the semiconductor layers 841 and 842 and the conductive layers 851 and 852. The insulating layer 824 covers the semiconductor layer 843. Here, the semiconductor layer 843 and the insulating layer 824 are etched using the same mask.

The conductive layer 850 is formed so as to surround, in the channel width direction, the region in which the semiconductor layers 841 to 843 are stacked with the insulating layer 824 therebetween (see FIG. 14C). Therefore, a gate electric field in the vertical direction and a gate electric field in the lateral direction are applied to this stack portion. In the OS transistor 800, the gate electric field refers to an electric field generated by a voltage applied to the conductive layer 850 (gate electrode layer). Accordingly, the whole stack portion of the semiconductor layers 841 to 843 can be electrically surrounded by the gate electric field, so that a channel is formed in the whole semiconductor layer 842 (bulk) in some cases. Thus, the OS transistor 800 can have high on-state current.

In this specification, the transistor structure in which a semiconductor region is surrounded by the electric field of a gate electrode layer is referred to as a surrounded channel (s-channel) structure. The s-channel structure can improve the frequency characteristics of the OS transistor 800. Specifically, the s-channel structure can improve cutoff frequency. The s-channel structure, because of its high on-state current, is suitable for a transistor that operates at high frequency and a semiconductor device such as large-scale integration (LSI) that needs a scaled down transistor. A semiconductor device including the transistor can operate at high frequency.

Scaling down of the OS transistor can provide a small highly integrated semiconductor device. The OS transistor preferably has, for example, a region where the channel length is greater than or equal to 10 nm and less than 1 µm, more preferably greater than or equal to 10 nm and less than 100 nm, still more preferably greater than or equal to 10 nm and less than 70 nm, yet still more preferably greater than or equal to 10 nm and less than 60 nm, even still more preferably greater than or equal to 10 nm and less than 30 nm. In addition, the OS transistor preferably has, for example, a region where the channel width is greater than or equal to 10 nm and less than 1 µm, more preferably greater than or equal to 10 nm and less than 100 nm, still more preferably greater than or equal to 10 nm and less than 70 nm, yet still more preferably greater than or equal to 10 nm and less than 60 nm, even still more preferably greater than or equal to 10 nm and less than 30 nm.

<Conductive Layer>

The conductive layers 850 to 853 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

The conductive layers 851 and 852 in the OS transistor 801 are formed using a hard mask used for forming the stack of the semiconductor layers 841 and 842. Therefore, the conductive layers 851 and 852 do not have regions in contact with the side surfaces of the semiconductor layers 841 and 842. For example, through the following steps, the semiconductor layers 841 and 842 and the conductive layers 851 and 852 can be formed. A two-layer oxide semiconductor film including the semiconductor layers 841 and 842 is formed. A single-layer or multi-layer conductive film is formed over the oxide semiconductor film. This conductive film is etched, so that a hard mask is formed. Using this hard mask, the two-layer oxide semiconductor film is etched to form the semiconductor layers 841 and 842. Then, the hard mask is etched to form the conductive layers 851 and 852.

<Semiconductor Layer>

The semiconductor layer 842 is an oxide semiconductor containing indium (In), for example. The semiconductor layer 842 can have high carrier mobility (electron mobility) by containing indium, for example. The semiconductor layer 842 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the oxide semiconductor, for example. Furthermore, the semiconductor layer 842 preferably contains zinc (Zn). When the oxide semiconductor contains zinc, the oxide semiconductor is easily crystallized in some cases.

The semiconductor layer 842 is not limited to the oxide semiconductor containing indium. The semiconductor layer 842 may be an oxide semiconductor which does not contain indium and contains at least one of zinc, gallium, and tin (e.g., a zinc tin oxide or a gallium tin oxide). For the semiconductor layer 842, an oxide with a wide energy gap is used, for example. The energy gap of the semiconductor layer 842 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV. The semiconductor region 840 is preferably formed using a CAAC-OS described in Embodiment 4. Alternatively, at least the semiconductor layer 842 is preferably formed using a CAAC-OS.

Note that in the case where an oxide semiconductor of the semiconductor region 840 is deposited by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 420° C., CAAC-OS can be formed. Thus, a conductor provided in the element layer DE-1 needs to withstand the deposition temperature of the oxide semiconductor in the semiconductor device 100 of Embodiment 1.

For example, the semiconductor layers 841 and 843 include one or more, or two or more elements other than oxygen contained in the semiconductor layer 842. Since the semiconductor layers 841 and 843 include one or more, or two or more elements other than oxygen contained in the semiconductor layer 842, an interface state is less likely to be formed at an interface between the semiconductor layers 841 and 842 and an interface between the semiconductor layers 842 and 843.

In the case of using an In-M-Zn oxide as the semiconductor layer 841, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the semiconductor layer 841 is formed by a sputtering method, a sputtering target with the above composition is preferably used. For example, In:M:Zn is preferably 1:3:2.

In the case of using an In-M-Zn oxide as the semiconductor layer 842, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the semiconductor layer 842 is formed by a sputtering method, a sputtering target with the above composition is preferably used. For example, In:M:Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the semiconductor layer 842 may be 4:2:3 or in the neighborhood of 4:2:3.

In the case of using an In-M-Zn oxide as the semiconductor layer 843, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. The semiconductor layer 843 may be an oxide that is the same type as that of the semiconductor layer 841. Note that the semiconductor layer 841 and/or the semiconductor layer 843 does not necessarily contain indium in some cases. For example, the semiconductor layer 841 and/or the semiconductor layer 843 may be gallium oxide.

<Energy Band Structure>

Figure 15A:
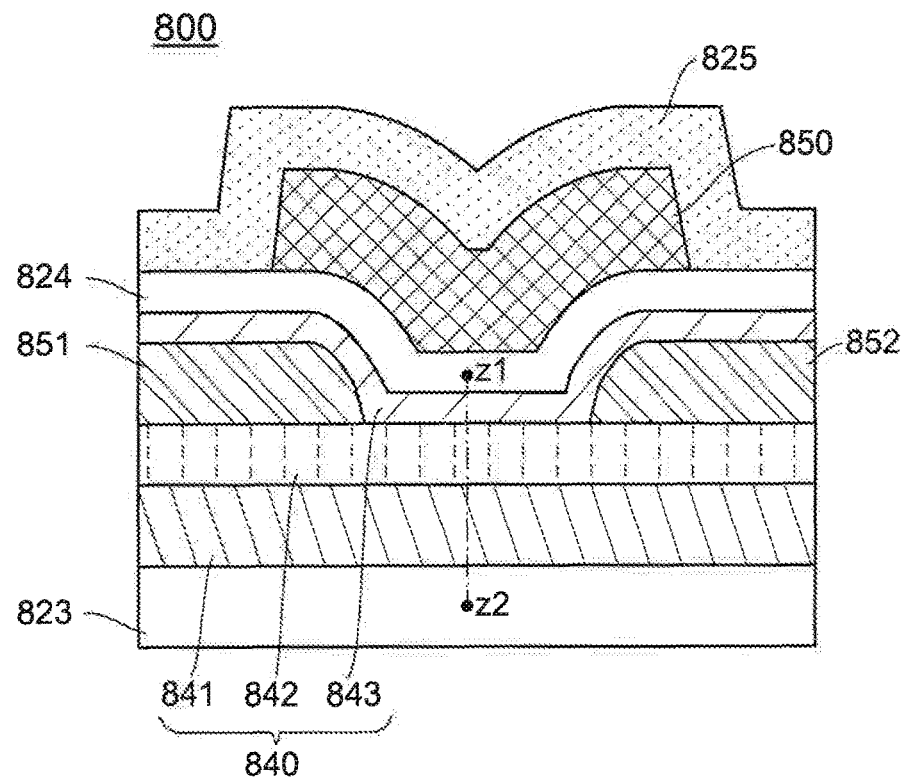
FIG. 15A is a partly enlarged view of FIG. 14B.
Figure 15B:
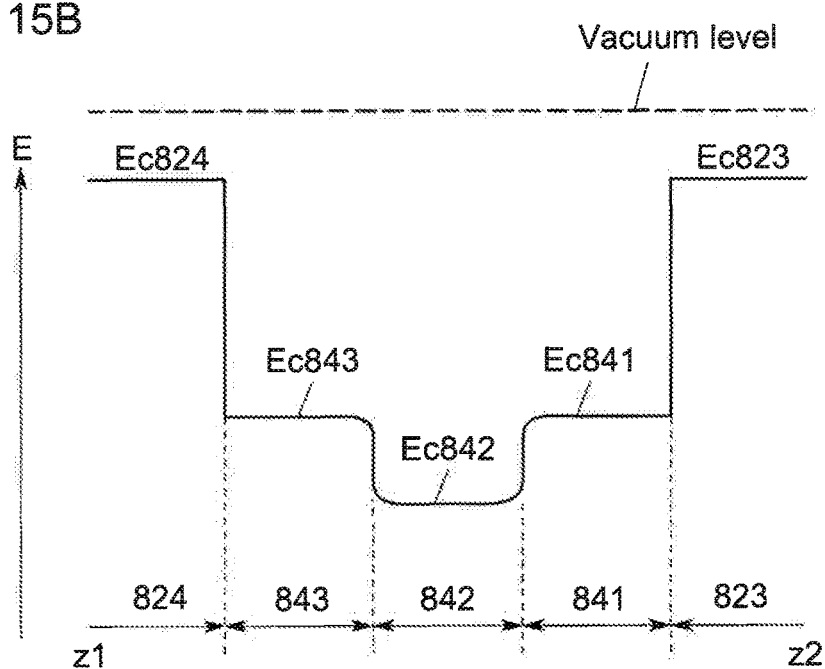
FIG. 15B is an energy band diagram of an OS transistor.

The function and effect of the semiconductor region 840 in which the semiconductor layers 841, 842, and 843 are stacked will be described with reference to FIGS. 15A and 15B. FIG. 15A is a partial enlarged view of an active layer (channel region) of the OS transistor 800 in FIG. 14B. FIG. 15B shows an energy band structure of a portion taken along dotted line z1-z2 (the channel formation region of the OS transistor 800) in FIG. 15A.

In FIG. 15B, Ec823, Ec841, Ec842, Ec843, and Ec824 indicate the energies at the bottom of the conduction band of the insulating layer 823, the semiconductor layer 841, the semiconductor layer 842, the semiconductor layer 843, and the insulating layer 824, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer. The energy difference between the vacuum level and the top of the valence band can be measured using an ultraviolet photoelectron spectroscopy (UPS) device.

Since the insulating layer 823 and the insulating layer 824 are insulators, Ec823 and Ec824 are closer to the vacuum level than Ec841, Ec842, and Ec843 (i.e., the insulating layer 823 and the insulating layer 824 have a lower electron affinity than the semiconductor layers 841, 842, and 843).

The semiconductor layer 842 is an oxide layer having higher electron affinity than those of the semiconductor layers 841 and 843. For example, as the semiconductor layer 842, an oxide having an electron affinity higher than those of the semiconductor layers 841 and 843 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that electron affinity is an energy gap between the vacuum level and the bottom of the conduction band.

An indium gallium oxide has low electron affinity and a high oxygen-blocking property. Therefore, the semiconductor layer 843 preferably contains an indium gallium oxide. The gallium atomic ratio [Ga/(In+Ga)] is, for example, higher than or equal to 70%, preferably higher than or equal to 80%, more preferably higher than or equal to 90%. At this time, when a gate voltage is applied, a channel is formed in the semiconductor layer 842 having the highest electron affinity among the semiconductor layers 841 to 843.

In some cases, there is a mixed region of the semiconductor layers 841 and 842 between the semiconductor layers 841 and 842. Furthermore, in some cases, there is a mixed region of the semiconductor layers 842 and 843 between the semiconductor layers 842 and 843. Because the mixed region has low interface state density, a stack of the semiconductor layers 841 to 843 has a band structure where energy at each interface and in the vicinity of the interface is changed continuously (continuous junction).

At this time, electrons move mainly in the semiconductor layer 842, not in the semiconductor layers 841 and 843. As described above, when the interface state density at the interface between the semiconductor layers 841 and 842 and the interface state density at the interface between the semiconductor layers 842 and 843 are decreased, electron movement in the semiconductor layer 842 is less likely to be inhibited and the on-state current of the OS transistor 800 can be increased.

As factors of inhibiting electron movement are decreased, the on-state current of the transistor can be increased. For example, in the case where there is no factor of inhibiting electron movement, electrons are assumed to move efficiently. Electron movement is inhibited, for example, in the case where physical unevenness in a channel formation region is large. The electron movement is also inhibited, for example, in the case where the density of defect states is high in the channel formation region.

To increase the on-state current of the OS transistor 800, for example, root mean square (RMS) roughness of a measurement area of 1 μm×1 μm of a top surface or a bottom surface of the semiconductor layer 842 (a formation surface; here, the semiconductor layer 841) is less than 1 nm, preferably less than 0.6 nm, more preferably less than 0.5 nm, still more preferably less than 0.4 nm. The average surface roughness (Ra) of the measurement area of 1 μm×1 μm is less than 1 nm, preferably less than 0.6 nm, more preferably less than 0.5 nm, still more preferably less than 0.4 nm. The maximum difference (P-V) with the measurement area of 1 μm×1 μm is less than 10 nm, preferably less than 9 nm, more preferably less than 8 nm, still more preferably less than 7 nm. RMS roughness, Ra, and P-V can be measured using a scanning probe microscope.

For example, in the case where the semiconductor layer 842 contains oxygen vacancies ($V_O$), donor levels are formed by entry of hydrogen into the sites of oxygen vacancies in some cases. A state in which hydrogen enters the sites of oxygen vacancies is denoted by $V_OH$ in the following description in some cases. $V_OH$ is a factor of decreasing the on-state current of the OS transistor 800 because $V_OH$ scatters electrons. Note that the sites of oxygen vacancies become more stable by entry of oxygen than by entry of hydrogen. Thus, by decreasing oxygen vacancies in the semiconductor layer 842, the on-state current of the OS transistor 800 can be increased in some cases.

For example, at a certain depth in the semiconductor layer 842 or in a certain region of the semiconductor layer 842, the concentration of hydrogen measured by secondary ion mass spectrometry (SIMS) is set to be higher than or equal to $1 \times 10^{16}$ atoms/cm$^3$ and lower than or equal to $2 \times 10^{20}$ atoms/cm$^3$, preferably higher than or equal to $1 \times 10^{16}$ atoms/cm$^3$ and lower than or equal to $5 \times 10^{19}$ atoms/cm$^3$, more preferably higher than or equal to $1 \times 10^{16}$ atoms/cm$^3$ and lower than or equal to $1 \times 10^{19}$ atoms/cm$^3$, still more preferably higher than or equal to $1 \times 10^{16}$ atoms/cm$^3$ and lower than or equal to $5 \times 10^{18}$ atoms/cm$^3$.

To decrease oxygen vacancies in the semiconductor layer 842, for example, there is a method in which excess oxygen in the insulating layer 823 is moved to the semiconductor layer 842 through the semiconductor layer 841. In that case, the semiconductor layer 841 is preferably a layer having oxygen permeability (a layer through which oxygen passes).

For example, heat treatment is performed at a temperature higher than or equal to 150° C. and lower than 600° C. after formation of the insulating layer 825, whereby oxygen contained in an insulating layer (e.g., the insulating layer 823) in contact with the semiconductor region 840 is diffused to be transferred to the semiconductor layer 842. This allows oxygen vacancies in the semiconductor layer 842 to be filled with oxygen. The density of localized levels of the semiconductor layer 842 is reduced; therefore, the OS transistor 800 with excellent electrical characteristics can be fabricated. Furthermore, the OS transistor 800 with high reliability and few variations with time in electrical characteristics or few variations in electrical characteristics due to a stress test can be fabricated.

The temperature of the heat treatment at that time can be preferably higher than or equal to 250° C. and lower than or equal to 500° C., more preferably higher than or equal to 300° C. and lower than or equal to 450° C. Thus, when a conductor in a lower layer of the element layer DE-2 in the semiconductor device 100 of Embodiment 1 has high heat resistance, the process temperature of the element layer DE-2 can be high, in which case the transistor DE2 with excellent characteristics and high reliability can be fabricated.

In the case where the OS transistor 800 has an s-channel structure, a channel is formed in the entire semiconductor layer 842. Therefore, as the semiconductor layer 842 has larger thickness, a channel region becomes larger. In other words, the thicker the semiconductor layer 842 is, the larger the on-state current of the OS transistor 800 is.

Moreover, the thickness of the semiconductor layer 843 is preferably as small as possible to increase the on-state current of the OS transistor 800. For example, the semiconductor layer 843 has a region with a thickness of less than 10 nm, preferably less than or equal to 5 nm, more preferably less than or equal to 3 nm. Meanwhile, the semiconductor layer 843 has a function of blocking entry of elements other than oxygen (such as hydrogen and silicon) contained in the adjacent insulator into the semiconductor layer 842 where a channel is formed. Thus, the semiconductor layer 843 preferably has a certain thickness. For example, the semiconductor layer 843 may have a region with a thickness of greater than or equal to 0.3 nm, preferably greater than or equal to 1 nm, more preferably greater than or equal to 2 nm. The semiconductor layer 843 preferably has an oxygen blocking property to inhibit outward diffusion of oxygen released from the insulating layers 823 and 824 and the like.

To improve the reliability of the OS transistor 800, preferably, the thickness of the semiconductor layer 841 is large and the thickness of the semiconductor layer 843 is small. For example, the semiconductor layer 841 has a region with a thickness of greater than or equal to 10 nm, preferably greater than or equal to 20 nm, more preferably greater than or equal to 40 nm, still more preferably greater than or equal to 60 nm. When the thickness of the semiconductor layer 841 is made large, a distance from an interface between the adjacent insulator and the semiconductor layer 841 to the semiconductor layer 842 in which a channel is formed can be large. Note that the semiconductor layer 841 has a region with a thickness of, for example, less than or equal to 200 nm, preferably less than or equal to 120 nm, more preferably less than or equal to 80 nm because the productivity of the semiconductor device might be decreased.

In order that the OS transistor 800 have stable electrical characteristics, it is effective to make the semiconductor layer 842 intrinsic or substantially intrinsic by reducing the concentration of impurities in the semiconductor region 840. Note that in this specification and the like, the carrier density of a substantially intrinsic oxide semiconductor film is higher than or equal to $1 \times 10^{-9}/cm^3$ and lower than $8 \times 10^{11}/cm^3$, preferably lower than $1 \times 10^{11}/cm^3$, more preferably lower than $1 \times 10^{10}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity levels serve as traps and might cause the electric characteristics of the transistor to deteriorate. Therefore, it is preferable to reduce the concentration of the impurities in the semiconductor layers 841 to 843 and at interfaces between the semiconductor layers.

For example, a region in which the concentration of silicon is higher than or equal to $1 \times 10^{16}$ atoms/$cm^3$ and lower than $1 \times 10^{19}$ atoms/$cm^3$ is provided between the semiconductor layers 841 and 842. The concentration of silicon is preferably higher than or equal to $1 \times 10^{16}$ atoms/$cm^3$ and lower than $5 \times 10^{18}$ atoms/$cm^3$, more preferably higher than or equal to $1 \times 10^{16}$ atoms/$cm^3$ and lower than $2 \times 10^{18}$ atoms/$cm^3$. A region in which the concentration of silicon is higher than or equal to $1 \times 10^{16}$ atoms/$cm^3$ and lower than $1 \times 10^{19}$ atoms/$cm^3$ is provided between the semiconductor layers 842 and 843. The concentration of silicon is preferably higher than or equal to $1 \times 10^{16}$ atoms/$cm^3$ and lower than $5 \times 10^{18}$ atoms/$cm^3$, more preferably higher than or equal to $1 \times 10^{16}$ atoms/$cm^3$ and lower than $2 \times 10^{18}$ atoms/$cm^3$. The concentration of silicon can be measured by SIMS.

It is preferable to reduce the concentration of hydrogen in the semiconductor layers 841 and 843 in order to reduce the concentration of hydrogen in the semiconductor layer 842. The semiconductor layers 841 and 843 each have a region in which the concentration of hydrogen is higher than or equal to $1 \times 10^{16}$ atoms/$cm^3$ and lower than or equal to $2 \times 10^{20}$ atoms/$cm^3$. The concentration of hydrogen is preferably higher than or equal to $1 \times 10^{16}$ atoms/$cm^3$ and lower than or equal to $5 \times 10^{19}$ atoms/$cm^3$, more preferably higher than or equal to $1 \times 10^{16}$ atoms/$cm^3$ and lower than or equal to $1 \times 10^{19}$ atoms/$cm^3$, still more preferably higher than or equal to $1 \times 10^{16}$ atoms/$cm^3$ and lower than or equal to $5 \times 10^{18}$ atoms/$cm^3$. The concentration of hydrogen can be measured by SIMS.

It is preferable to reduce the concentration of nitrogen in the semiconductor layers 841 and 843 in order to reduce the concentration of nitrogen in the semiconductor layer 842. The semiconductor layers 841 and 843 each have a region in which the concentration of nitrogen is higher than or equal to $1 \times 10^{16}$ atoms/$cm^3$ and lower than $5 \times 10^{19}$ atoms/$cm^3$. The concentration of nitrogen is preferably higher than or equal to $1 \times 10^{16}$ atoms/$cm^3$ and lower than or equal to $5 \times 10^{18}$ atoms/$cm^3$, more preferably higher than or equal to $1 \times 10^{16}$ atoms/$cm^3$ and lower than or equal to $1 \times 10^{18}$ atoms/$cm^3$, still more preferably higher than or equal to $1 \times 10^{16}$ atoms/$cm^3$ and lower than or equal to $5 \times 10^{17}$ atoms/$cm^3$. The concentration of nitrogen can be measured by SIMS.

A transistor in which the above highly purified oxide semiconductor is used for a channel formation region exhibits an extremely low off-state current. When the voltage between a source and a drain is set at about 0.1 V, 5 V, or 10 V, for example, the off-state current standardized on the channel width of the transistor can be as low as several yoctoamperes per micrometer to several zeptoamperes per micrometer.

FIGS. 14A to 14D illustrate examples in which the semiconductor region 840 has a three-layer structure; however, one embodiment of the present invention is not limited thereto. For example, the semiconductor region 840 may have a two-layer structure without the semiconductor layer 841 or 843. Alternatively, the semiconductor region 840 can have a four-layer structure in which a semiconductor layer similar to the semiconductor layers 841 to 843 is provided over or under the semiconductor layer 841 or over or under the semiconductor layer 843. Alternatively, the semiconductor region 840 can have an n-layer structure (n is an integer of 5 or more) in which semiconductor layers similar to the semiconductor layers 841 to 843 are provided at two or more of the following positions: over the semiconductor layer 841, under the semiconductor layer 841, over the semiconductor layer 843, and under the semiconductor layer 843.

In the case where the OS transistor 800 has no back gate electrode, neither the conductive layer 853 nor the insulating layer 822 is provided, and the insulating layer 823 is formed over the insulating layer 821.

<Insulating Layers>

The insulating layers 821 to 825 are each formed using an insulating film having a single-layer structure or a layered structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

In this specification, an oxynitride refers to a compound that contains more oxygen than nitrogen, and a nitride oxide refers to a compound that contains more nitrogen than oxygen. In this specification and the like, an oxide whose nitrogen concentration is lower than 1 atomic % can also be used as an insulating material.

The insulating layers 823 and 824 each preferably contain an oxide because they are in contact with the semiconductor region 840. In particular, the insulating layers 823 and 824 each preferably contain an oxide material from which part of oxygen is released by heating. The insulating layers 823 and 824 each preferably contain an oxide containing oxygen more than that in the stoichiometric composition. Part of oxygen is released by heating from an oxide film containing oxygen more than that in the stoichiometric composition. Oxygen released from the insulating layers 823 and 824 is supplied to the semiconductor region 840 that is an oxide semiconductor, so that oxygen vacancies in the oxide semiconductor can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating layers 821 and 825 each preferably have a passivation function of preventing oxygen contained in the insulating layers 823 and 824 from being decreased. The insulating layers 821 and 825 each preferably have a function of blocking oxygen, hydrogen, water, an alkali metal, an alkaline earth metal, and the like. The insulating layers 821 and 825 can prevent outward diffusion of oxygen from the semiconductor region 840 and entry of hydrogen, water, or the like into the semiconductor region 840 from the outside. The insulating layers 821 and 825 may each be formed using, for example, at least one insulating layer of silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, hafnium oxynitride, or the like so that they can have such a function.

<Charge Trap Layer>

While the threshold voltage of a Si transistor can be easily controlled by channel doping, the threshold voltage of an OS transistor is difficult to change effectively by channel doping. In an OS transistor, the threshold voltage can be changed by injecting electrons into a charge trap layer. For example, the injection of electrons into the charge trap layer can be performed with the use of the tunnel effect By applying a positive voltage to the conductive layer 853, tunnel electrons are injected into the charge trap layer.

In the OS transistor 800, a charge trap layer can be provided over the insulating layer 823. An example of the charge trap layer is an insulating layer formed using hafnium oxide, aluminum oxide, tantalum oxide, aluminum silicate, or the like. The insulating layer 823 can have a three-layer structure of a silicon oxide layer, a hafnium oxide layer, and a silicon oxide layer, for example.

<Substrate>

As the substrate 820, an insulator substrate, a semiconductor substrate, or a conductor substrate can be used, for example. As the insulator substrate, a glass substrate, a quartz substrate, a sapphire substrate, a stabilized zirconia substrate (e.g., an yttria-stabilized zirconia substrate), or a resin substrate can be used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. The semiconductor substrate can be either a bulk semiconductor substrate or a silicon on insulator (SOI) substrate in which a semiconductor layer is provided for a semiconductor substrate with an insulating region positioned therebetween. As the conductor substrate, a graphite substrate, a metal substrate, an alloy substrate, a conductive resin substrate, or the like can be used. A substrate including a metal nitride, a substrate including a metal oxide, or the like can be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. As the element provided over the substrate, a capacitor, a resistor, a switching element, a light-emitting element, a memory element, or the like can be used.

A flexible substrate may be used as the substrate 820. As a method for providing a transistor over a flexible substrate, there is a method in which a transistor is formed over a non-flexible substrate (e.g., a semiconductor substrate), and then the transistor is separated and transferred to the substrate 820, which is a flexible substrate. In that case, a separation layer is preferably provided between the non-flexible substrate and the transistor. As the substrate 820, a sheet, a film, or foil containing a fiber can be used. The substrate 820 may have elasticity. The substrate 820 may have a property of returning to its original shape when bending or pulling is stopped. Alternatively, the substrate 820 may have a property of not returning to its original shape. The thickness of the substrate 820 is, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate 820 has a small thickness, the weight of the semiconductor device can be reduced. When the substrate 820 has a small thickness, even in the case of using glass or the like, the substrate 820 may have elasticity or a property of returning to its original shape when bending or pulling is stopped. Therefore, an impact applied to the semiconductor device over the substrate 820, which is caused by dropping or the like, can be reduced. That is, the semiconductor device can have high durability.

For the flexible substrate 820, metal, an alloy, resin, glass, or fiber thereof can be used, for example. The flexible substrate preferably has a lower coefficient of linear expansion because deformation due to an environment is suppressed. The flexible substrate is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate because of its low coefficient of linear expansion.

<<Structural Example 2 of OS Transistor>>

Figure 16A:
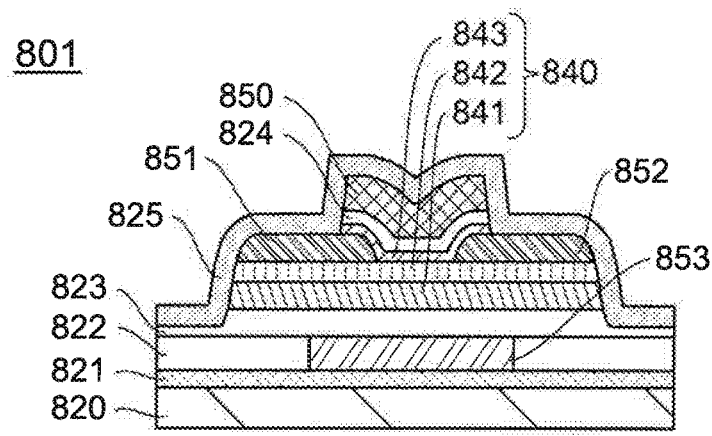
FIGS. 16A to 16C are cross-sectional views each illustrating a structural example of an OS transistor.

The semiconductor layer 843 and the insulating layer 824 may be etched using the conductive layer 850 as a mask. FIG. 16A illustrates a structural example of an OS transistor fabricated through such a step. In the OS transistor 801 in FIG. 16A, end portions of the semiconductor layer 843 and the insulating layer 824 are substantially aligned with an end portion of the conductive layer 850. The semiconductor layer 843 and the insulating layer 824 are provided only below the conductive layer 850.

<<Structural Example 3 of OS Transistor>>

Figure 16B:
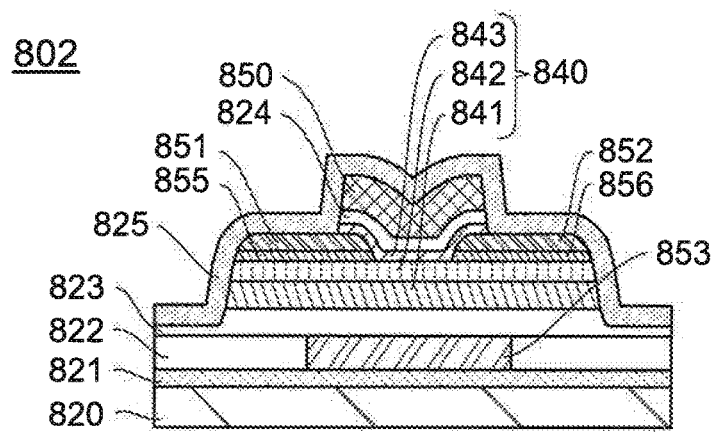

An OS transistor 801 in FIG. 16B has a device structure in which conductive layers 855 and 856 are added to the OS transistor 801. A pair of electrodes functioning as a source electrode and a drain electrode of the OS transistor 802 is formed using a stack of the conductive layers 851 and 855 and a stack of the conductive layers 852 and 856.

The conductive layers 855 and 856 are formed using a single-layer or multilayer conductor. The conductive layers 855 and 856 can be formed using, for example, a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy film or a compound may be used, for example, and a conductor containing aluminum, a conductor containing copper and titanium, a conductor containing copper and manganese, a conductor containing indium, tin, and oxygen, a conductor containing titanium and nitrogen, or the like may be used as the conductor.

The conductive layers 855 and 856 may have a property of transmitting visible light. Alternatively, the conductive layers 855 and 856 may have a property of not transmitting visible light, ultraviolet light, infrared light, or an X-ray by reflecting or absorbing it. In some cases, such a property can suppress a change in the electrical properties of the OS transistor 802 due to stray light.

The conductive layers 855 and 856 may preferably be formed using a layer that does not form a Schottky barrier with the semiconductor layer 842 or the like. Accordingly, the on-state characteristics of the OS transistor 802 can be improved.

The conductive layers 855 and 856 preferably have higher resistance than the conductive layers 851 and 852 according to circumstances. The conductive layers 855 and 856 preferably have lower resistance than the channel (the semiconductor layer 842) of the OS transistor 802 according to circumstances. For example, the resistivity of the conductive layers 855 and 856 is set to higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The conductive layers 855 and 856 having resistivity within the above range can reduce electric field concentration in a boundary portion between the channel and the drain. Therefore, a change in electrical characteristics of the OS transistor 802 can be suppressed. In addition, punch-through current generated by an electric field from the drain can be reduced. Thus, a transistor with small channel length can have favorable saturation characteristics. Note that in a circuit configuration where the source and the drain do not interchange, only one of the conductive layers 855 and 856 (e.g., the layer on the drain side) is preferably provided according to circumstances.

<<Structural Example 4 of OS Transistor>>

Figure 16C:
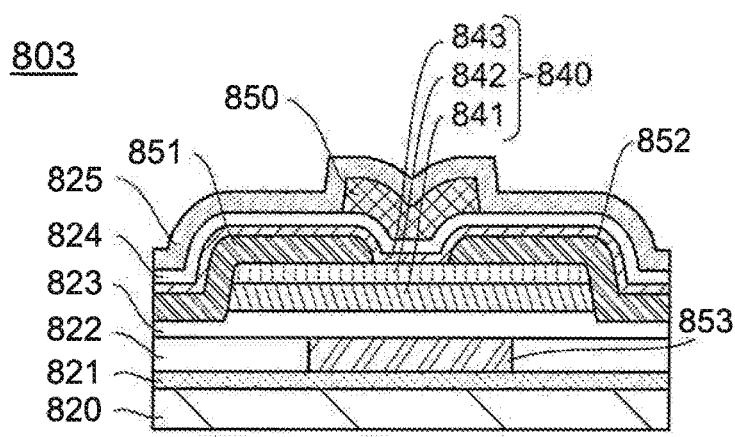

In the OS transistor 800 in FIGS. 14A to 14D, the conductive layers 851 and 852 may be in contact with side surfaces of the semiconductor layers 841 and 842. Such a structural example is illustrated in FIG. 16C. In an OS transistor 803 in FIG. 16C, the conductive layers 851 and 852 may be in contact with side surfaces of the semiconductor layers 841 and 842.

In the fabrication process of the semiconductor device, insulators, conductors, and semiconductors can be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like. For example, it is preferable that insulating films be formed by a CVD method, more preferably a PECVD method because coverage can be further improved. In the case where a CVD method is employed for film formation, it is preferable to use a thermal CVD method, an MOCVD method, or an ALD method in order to reduce plasma damage. In the case where a sputtering method is employed for film formation, a facing-target-type sputtering apparatus, a parallel-plate-type sputtering apparatus, or the like can be used. For example, the semiconductor layer 842 of the semiconductor region 840 is preferably formed with a facing-target-type sputtering apparatus.

Embodiment 4

<<Oxide Semiconductor Structure>>

In this embodiment, the structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and thus has an unstable structure. For this reason, an a-like OS has physical properties similar to those of an amorphous oxide semiconductor.

<CAAC-OS>

A CAAC-OS is an oxide semiconductor having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

The CAAC-OS observed with a TEM will be described below. It can be found from a high-resolution TEM image of a cross section of the CAAC-OS observed from the direction substantially parallel to the sample surface that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

In addition, according to the high-resolution TEM image, the CAAC-OS has a characteristic atomic arrangement. The size of a pellet is greater than or equal to 1 nm and less than or equal to 3 nm, and the size of a space caused by the tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

From a Cs-corrected high-resolution TEM image of a plane of the CAAC-OS film observed from the direction substantially perpendicular to the sample surface, it can be found that metal atoms are arranged in a triangular, quadrangular, or hexagonal configuration in a pellet. However, there is no regularity of arrangement of metal atoms between different pellets.

Next, a CAAC-OS analyzed by X-ray diffraction (XRD) will be described. For example, when the structure of a CAAC-OS including an $InGaZnO_4$ crystal is analyzed by an out-of-plane method, a peak appears at a diffraction angle (2θ) of around 31°. This peak is derived from the (009) plane of the $InGaZnO_4$ crystal, which indicates that crystals in the CAAC-OS have c-axis alignment, and that the c-axes are aligned in the direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. In a preferable CAAC-OS whose structure is analyzed by an out-of-plane method, a peak appears when 2θ is around 31° and no peak appears when 2θ is around 36°.

On the other hand, in structural analysis of the CAAC-OS by an in-plane method in which an X-ray is incident on a sample in the direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), a peak is not clearly observed. In contrast, in the case of a single crystal oxide semiconductor of $InGaZnO_4$, when φ scan is performed with 2θ fixed at around 56°, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an $InGaZnO_4$ crystal in the direction parallel to the sample surface, such a diffraction pattern (also referred to as a selected-area transmission electron diffraction pattern) can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, a ring-like diffraction pattern is observed when an electron beam with a probe diameter of 300 nm is incident on the same sample in the direction perpendicular to the sample surface. Thus, the electron diffraction also indicates that the a-axes and b-axes of the pellets included in the CAAC-OS do not have regular alignment.

As described above, the CAAC-OS is an oxide semiconductor with high crystallinity. Entry of impurities, formation of defects, or the like might decrease the crystallinity of an oxide semiconductor. This means that the CAAC-OS has a negligible number of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, resulting in the disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. The impurity contained in the oxide semiconductor might serve as a carrier trap or serve as a carrier generation source. Furthermore, oxygen vacancies in the oxide semiconductor might serve as carrier traps or serve as carrier generation sources when hydrogen is captured therein.

The CAAC-OS having a small number of impurities and oxygen vacancies is an oxide semiconductor with low carrier density (specifically, lower than $8\times10^{11}/cm^3$, preferably lower than $1\times10^{11}/cm^3$, more preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

A nc-OS has a region in which a crystal part is observed and a region in which a crystal part is not clearly observed in a high-resolution TEM image. In most cases, the size of a crystal part included in the nc-OS is greater than or equal to 1 nm and less than or equal to 100 nm, or greater than or equal to 1 nm and less than or equal to 3 nm. An oxide semiconductor including a crystal part with a size greater than 10 nm and less than or equal to 100 nm may be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor and an a-like OS, depending on an analysis method. For example, when the nc-OS is analyzed by an out-of-plane method using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Furthermore, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor and an a-like OS. Note that there is no regularity of crystal orientation between different pellets in the nc-OS. Therefore, the nc-OS has a higher density of defect states than the CAAC-OS.

<a-Like OS>

Note that an a-like OS is an oxide semiconductor having a structure between the nc-OS and the amorphous oxide semiconductor. In a high-resolution TEM image of the a-like OS, a void may be observed. Furthermore, in the high-resolution TEM image, there are a region where a crystal part is clearly observed and a region where a crystal part is not observed. The a-like OS has an unstable structure because it contains a void. Growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to estimate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stack including two or more of an amorphous oxide semiconductor, an a-like OS, an nc-OS, and a CAAC-OS, for example. Information about this specification and the like will be described below.

In the drawings, the size, the layer thickness, or the region may be exaggerated for clarity. Therefore, the scale is not necessarily limited to that illustrated in the drawings. Note that in the drawings, ideal examples are schematically illustrated, and shapes or values are not limited to those illustrated in the drawings. For example, the following can be included: variation in signal, voltage, or current due to noise or difference in timing.

In this specification, terms for describing arrangement, such as "over" and "under," may be used for convenience to describe the positional relation between components with reference to drawings. The positional relation between components is changed as appropriate in accordance with the direction in which each component is described. Thus, there is no limitation on terms used in this specification, and description can be made appropriately depending on the situation.

The positional relation of circuit blocks in block diagrams are specified for description, and even in the case where different circuit blocks have different functions in the diagrams, the different circuit blocks may be provided in an actual circuit block so that different functions are achieved in the same circuit block. In addition, the functions of circuit blocks are specified for description, and even in the case where one circuit block is illustrated, blocks may be provided in an actual circuit block so that processing performed by one circuit block is performed by a plurality of circuit blocks.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, trigonal and rhombohedral crystal systems are included in a hexagonal crystal system.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification and the like, it may be possible for those skilled in the art to constitute one embodiment of the invention even when portions to which all the ports of an active element (e.g., a transistor or a diode), a passive element (e.g., a capacitor or a resistor), and the like are connected are not specified. In other words, one embodiment of the invention is clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the port is connected may be more than one, it is not necessary to specify the portions to which the port is connected. Therefore, it may be possible to constitute one embodiment of the invention by specifying only portions to which some of ports of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the present invention is clear, and it can be determined that the embodiment is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that contents that are not specified in the specification and the like can be excluded from one embodiment of the invention. Alternatively, when the range of a value that is defined by the maximum and minimum values is described, part of the range is appropriately narrowed or part of the range is removed, whereby one embodiment of the invention excluding part of the range can be constituted. In this manner, it is possible to specify the technical scope of one embodiment of the present invention so that a conventional technology is excluded, for example.

As a specific example, a diagram of a circuit including first to fifth transistors is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

Note that in this specification and the like, part of a diagram or text described in one embodiment can be taken out to constitute one embodiment of the invention. Thus, in the case where a diagram or text related to a certain portion is described, the contents taken out from part of the diagram or the text are also disclosed as one embodiment of the invention, and one embodiment of the invention can be constituted. The embodiment of the present invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to take out M circuit elements (e.g., transistors or capacitors; M is an integer, where M<N) and constitute one embodiment of the invention. For another example, it is possible to take out M layers (M is an integer, where M<N) from a cross-sectional view in which N layers (N is an integer) are provided and constitute one embodiment of the invention. For another example, it is possible to take out M elements (M is an integer, where M<N) from a flow chart in which N elements (N is an integer) are provided and constitute one embodiment of the invention. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

In the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

In this specification and the like, what is illustrated in at least a diagram (which may be part of the diagram) is disclosed as one embodiment of the invention, and one embodiment of the invention can be constituted. Therefore, when certain contents are described in a diagram, the contents are disclosed as one embodiment of the invention even when the contents are not described with text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

In one embodiment of the present invention, a variety of switches can be used as a switch. A switch is brought into a conduction state or a non-conduction state (is turned on or off) to determine whether to have a current flow therethrough or not. Alternatively, the switch has a function of selecting and changing a current path, and for example, selects a current path 1 or a current path 2. For example, an electrical switch, a mechanical switch, or the like can be used as a switch. That is, any element can be used as a switch as long as it can control a current, without limitation to a certain element. A transistor (e.g., a bipolar transistor or a metal oxide semiconductor (MOS) transistor), a diode (e.g., a PN diode, a PIN diode, a Schottky diode, a metal-insulator-metal (MIM) diode, a metal-insulator-semiconductor (MIS) diode, or a diode-connected transistor), or a logic circuit in which such elements are combined can be used as a switch. An example of a mechanical switch is a switch formed using a MEMS (micro electro mechanical system) technology, such as a digital micromirror device (DMD). Such a switch includes an electrode which can be moved mechanically, and operates by controlling conduction and non-conduction in accordance with movement of the electrode.

In one embodiment of the present invention, there is no particular limitation on the device structure of a capacitor intentionally provided as an element. For example, either a MIM capacitor or a MOS capacitor can be used.

EXPLANATION OF REFERENCE

10: logic cell, 10a: logic circuit, 11: logic cell, 11a: logic circuit, 15: wiring grid, 15a: grid point, 16: wiring grid, 16a: grid point, 20: inverter cell, 20N: transistor, 20P: transistor, 21C: region, 22n: region, 22p: region, 23: wiring, 24a: wiring, 24b: wiring, 24c: wiring, 24d: wiring, 25a: wiring, 25b: wiring, 26a: wiring, 26b: wiring, 30: circuit, 30-1: circuit, 30-2: circuit, 31: circuit, 32: circuit, 33: circuit, 34: logic circuit, 35: logic circuit, 36A: backup circuit, 36B: backup circuit, 36C: backup circuit, 40: single crystal silicon wafer, 41: insulating layer, 42: insulating layer, 43: insulating layer, 44: insulating layer, 52-1: insulating layer, 52-3: insulating layer, 53-1: insulating layer, 53-2: insulating layer, 53-3: insulating layer, 53-4: insulating layer, 53-5: insulating layer, 53-6: insulating layer, 61: wiring, 62: wiring, 63: wiring, 64: wiring, 65: wiring, 66: wiring, 67: wiring, 68: wiring, 71: plug, 72: plug, 73: plug, 74: plug, 75: plug, 76: plug, 100: semiconductor device, 101: semiconductor device, 110: logic cell, 111: logic cell, 112: circuit, 200: processing unit (PU), 201: processor core, 202: power management unit (PMU), 203: power switch (PSW), 204: clock control circuit, 205: circuit, 210: power supply circuit, 220: terminal, 221: terminal, 222: terminal, 231: control unit, 232: program counter, 233: pipeline register, 234: pipeline register, 235: register file, 236: arithmetic logic unit (ALU), 237: data bus, 240: logic circuit, 250: flip-flop (FF), 251: scan flip-flop (SFF), 252: backup circuit, 253: selector (SEL), 254: flip-flop (FF), 254a: circuit, 700: single crystal silicon wafer, 710: element isolation layer, 771: well, 772: active layer, 773: low concentration impurity region, 774: high concentration impurity region, 775: conductive region, 776: gate insulating layer, 777: gate electrode, 778: sidewall insulating layer, 779: sidewall insulating layer, 800: OS transistor, 801: OS transistor, 802: OS transistor, 803: OS transistor, 820: substrate, 821: insulating layer, 822: insulating layer, 823: insulating layer, 824: insulating layer, 825: insulating layer, 840: semiconductor region, 841: semiconductor layer, 842: semiconductor layer, 843: semiconductor layer, 850: conductive layer, 851: conductive layer, 852: conductive layer, 853: conductive layer, 855: conductive layer, 856: conductive layer, 900: portable game machine, 901: housing, 902: housing, 903: display portion, 904: display portion, 905: microphone, 906: speaker, 907: operation key, 908: stylus, 910: portable information terminal, 911: housing, 912: housing, 913: display portion, 914: display portion, 915: joint, 916: operation key, 920: laptop, 921: housing, 922: display portion, 923: keyboard, 924: pointing device, 930: electric refrigerator-freezer, 931: housing, 932: refrigerator door, 933: freezer door, 940: video camera, 941: housing, 942: housing, 943: display portion, 944: operation key, 945: lens, 946: joint, 950: motor vehicle, 951: car body, 952: wheels, 953: dashboard, 954: lights, 7000: electronic component, 7001: lead, 7002: printed wiring substrate, 7003: circuit portion, 7004: circuit substrate, A1: port, B1: port, BK: port, C1: capacitor, CK: port, CK1: port, CKB1: port, D: port, DE1: transistor, DE2: transistor, DE-1: element layer, DE-2: element layer, $L_{15}$: grid interval, $L_{16}$: grid interval, MA-1: wiring layer, MA-2: wiring layer, MA-3: wiring layer, MB-1: wiring layer, MB-2: wiring layer, MB-3: wiring layer, MB-k: wiring layer, MVA1: layer, MVA2: layer, MVA3: layer, MVA4: layer, MVA5: layer, MVA6: layer, N35: node, OBG: port, PL: port, Q: port, QB: port, RE: port, RT: port, SD: port, SD_IN: port, SE: port, SN1: node, Tn: Si transistor, Tp: Si transistor, TO1: transistor, TO2: transistor, TO3: transistor, TO6: transistor, TO7: transistor, TO8: transistor, VH: port, VL: port, and Y1: port This application is based on Japanese Patent Application serial No. 2015-022933 filed with Japan Patent Office on Feb. 9, 2015, the entire contents of which are hereby incorporated by reference.

The invention claimed is:

1. A semiconductor device comprising:
a first element layer including a first transistor,
a plurality of first wiring layers over the first element layer, each first wiring layer including a plurality of first wirings;
a first interlayer insulating film located between one of the plurality of first wiring layers and adjacent one of the plurality of first wiring layers, wherein the first interlayer insulating film includes a plurality of first plugs electrically connected to the plurality of first wirings;
a second element layer including a second transistor over the plurality of first wiring layers;
a plurality of second wiring layers over the second element layer, each second wiring layer including a plurality of second wirings; and a second interlayer insulating film located between one of the plurality of second wiring layers and adjacent one of the plurality of second wiring layers, wherein the second interlayer insulating film includes a plurality of second plugs electrically connected to the plurality of second wirings.

2. The semiconductor device according to claim 1, wherein the plurality of first plugs comprise tungsten.

3. The semiconductor device according to claim 1, wherein the plurality of second plugs comprise at least one of aluminum, copper, tungsten, and titanium.

4. The semiconductor device according to claim 1, wherein the plurality of first wirings comprise at least one element selected from silicon, tungsten, molybdenum, tantalum, titanium, chromium, niobium, vanadium, and platinum.

5. The semiconductor device according to claim 1, wherein the plurality of second wirings comprise at least one element selected from aluminum, copper, titanium, tungsten, and molybdenum.

6. The semiconductor device according to claim 1, wherein the plurality of second wirings comprise aluminum and titanium nitride.

7. The semiconductor device according to claim 1, wherein resistivities of the plurality of second wiring layers are lower than those of the plurality of first wiring layers.

8. The semiconductor device according to claim 1,
wherein the semiconductor device includes a plurality of logic cells, and
wherein an input port and an output port of one of the plurality of logic cells are provided in one of the plurality of second wiring layers.

9. The semiconductor device according to claim 1, wherein a channel formation region of the second transistor comprises an oxide semiconductor layer.

10. An electronic component comprising:
a chip; and
a lead,
wherein the semiconductor device according to claim 1 is provided on the chip, and
wherein the lead is electrically connected to the chip.

11. An electronic device comprising:
the semiconductor device according to claim 1; and
at least one of a display device, a touch panel, a microphone, a speaker, an operation key, and a housing.

12. A semiconductor device comprising:
a first element layer including a first transistor,
a first wiring layer over the first element layer, the first wiring layer including a plurality of first wirings;
a second element layer including a second transistor over the first wiring layer,
a plurality of second wiring layers over the second element layer, each second wiring layer including a plurality of second wirings; and
an interlayer insulating film located between one of the plurality of second wiring layers and adjacent one of the plurality of second wiring layers, wherein the interlayer insulating film includes a plurality of plugs electrically connected to the plurality of second wirings.

13. The semiconductor device according to claim 12, wherein the plurality of plugs comprise at least one of aluminum, copper, tungsten, and titanium.

14. The semiconductor device according to claim 12, wherein the plurality of first wirings comprise at least one element selected from silicon, tungsten, molybdenum, tantalum, titanium, chromium, niobium, vanadium, and platinum.

15. The semiconductor device according to claim 12, wherein the plurality of second wirings comprise at least one element selected from aluminum, copper, titanium, tungsten, and molybdenum.

16. The semiconductor device according to claim 12, wherein the plurality of second wirings comprise aluminum and titanium nitride.

17. The semiconductor device according to claim 12, wherein resistivities of the plurality of second wiring layers are lower than that of the first wiring layer.

18. The semiconductor device according to claim 12,
wherein the semiconductor device includes a plurality of logic cells, and
wherein an input port and an output port of one of the plurality of logic cells are provided in one of the plurality of second wiring layers.

19. The semiconductor device according to claim 12, wherein a channel formation region of the second transistor comprises an oxide semiconductor layer.

20. An electronic component comprising:
a chip; and
a lead,
wherein the semiconductor device according to claim 12 is provided on the chip, and
wherein the lead is electrically connected to the chip.

21. An electronic device comprising:
the semiconductor device according to claim 12; and
at least one of a display device, a touch panel, a microphone, a speaker, an operation key, and a housing.

* * * * *